US012707581B2

(12) United States Patent
Choi et al.

(10) Patent No.: US 12,707,581 B2
(45) **Date of Patent: *Aug. 11, 2026**

(54) CONNECTION BRACKET AND DISPLAY APPARATUS INCLUDING THE SAME

(71) Applicant: SAMSUNG ELECTRONICS CO., LTD., Suwon-si (KR)

(72) Inventors: Daesu Choi, Suwon-si (KR); Yousub Lee, Suwon-si (KR); Hyunyong Choi, Suwon-si (KR); Jaemin Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 79 days.

This patent is subject to a terminal disclaimer.

(21) Appl. No.: 18/741,053

(22) Filed: Jun. 12, 2024

(65) Prior Publication Data

US 2025/0071917 A1 Feb. 27, 2025

Related U.S. Application Data

(63) Continuation of application No. PCT/KR2024/006992, filed on May 23, 2024.

(30) Foreign Application Priority Data

Aug. 22, 2023 (KR) ........................ 10-2023-0110150

(51) Int. Cl.
*H02K 5/02* (2006.01)
*F16C 11/04* (2006.01)
(Continued)

(52) U.S. Cl.
CPC ............ *H05K 5/0226* (2013.01); *F16C 11/04* (2013.01); *H05K 5/0247* (2013.01); *H05K 5/30* (2025.01);
(Continued)

(58) Field of Classification Search
None
See application file for complete search history.

(56) References Cited

U.S. PATENT DOCUMENTS 7,283,353 B1 * 10/2007 Jordan ..................... H04N 5/64 345/1.3
8,317,146 B2 11/2012 Jung et al.
(Continued)

FOREIGN PATENT DOCUMENTS

CN 217583770 U 10/2022
JP 2012-137899 7/2012
(Continued)

OTHER PUBLICATIONS

Written Opinion issued on Sep. 19, 2024 for International Application No. PCT/KR2024/006992.
(Continued)

*Primary Examiner* — Xanthia C Relford
(74) *Attorney, Agent, or Firm* — STAAS & HALSEY LLP

(57) ABSTRACT

A display apparatus comprises: a first display unit comprising a first connector, a second display unit disposed adjacent to one side of the first display unit and comprising a second connector, and a connection bracket configured to connect the first display unit and the second display unit. The connection bracket comprises: a third connector configured to be electrically connected to the first connector, a fourth connector configured to be electrically connected to the second connector, and a hinge.

15 Claims, 25 Drawing Sheets

(51) Int. Cl.

*H05K 5/02* (2006.01)
*H05K 5/30* (2025.01)
*F16M 11/08* (2006.01)
*F16M 11/22* (2006.01)
*F16M 13/02* (2006.01)

(52) U.S. Cl.

CPC .............. *F16M 11/08* (2013.01); *F16M 11/22* (2013.01); *F16M 13/022* (2013.01)

(56) References Cited

U.S. PATENT DOCUMENTS

| | | | | |
|---|---|---|---|---|
| 8,376,581 | B2 | 2/2013 | Auld et al. | |
| 9,746,931 | B2 | 8/2017 | Setiawan et al. | |
| 9,854,701 | B2 | 12/2017 | Choi et al. | |
| 10,423,193 | B2 | 9/2019 | Kim et al. | |
| 11,023,195 | B2 * | 6/2021 | Kwon | G09F 9/302 |
| 11,288,028 | B2 | 3/2022 | Miles et al. | |
| 11,935,440 | B2 | 3/2024 | Yoon et al. | |
| 2007/0084978 | A1 | 4/2007 | Martin et al. | |
| 2014/0218266 | A1 | 8/2014 | Chen et al. | |
| 2017/0347466 | A1 * | 11/2017 | Kang | G09G 3/20 |
| 2022/0397942 | A1 | 12/2022 | Yao et al. | |

FOREIGN PATENT DOCUMENTS

| | | |
|---|---|---|
| KR | 10-2009-0035408 | 4/2009 |
| KR | 10-2011-0084219 | 7/2011 |
| KR | 10-1369962 | 3/2014 |
| KR | 10-2015-0011581 | 2/2015 |
| KR | 10-2015-0093090 | 8/2015 |
| KR | 10-2017-0072399 | 6/2017 |
| KR | 10-2017-0098551 | 8/2017 |
| KR | 10-2018-0088913 | 8/2018 |
| KR | 10-2019-0083562 | 7/2019 |
| KR | 10-2189234 | 12/2020 |
| WO | WO 2006/128594 | 12/2006 |
| WO | WO 2012/110900 A2 | 8/2012 |

OTHER PUBLICATIONS

International Search Report issued on Sep. 19, 2024 for International Application No. PCT/KR2024/006992.

* cited by examiner

CONNECTION BRACKET AND DISPLAY APPARATUS INCLUDING THE SAME

CROSS-REFERENCE TO RELATED APPLICATIONS

This application is a continuation application, under 35 U.S.C. § 111(a), of International Application No. PCT/KR2024/006992, filed on May 23, 2024, which claims priority under 35 U.S.C. § 119 to Korean Patent Application 10-2023-0110150, filed on Aug. 22, 2023, in the Korean Intellectual Property Office, the disclosures of which are incorporated by reference herein in their entireties.

TECHNICAL FIELD

The present disclosure relates to a connection bracket and a display apparatus including the same.

BACKGROUND ART

A display apparatus is a kind of an output apparatus that converts obtained or stored electrical information into visual information and displays the visual information to a user.

The display apparatus may be classified into a self-luminous type including a display panel that emits light on its own such as an organic light emitting diode (OLED), and a non-self-luminous type including a display panel that does not emit light on its own, and receives light from a backlight unit such as a liquid crystal display (LCD).

The display apparatus may include a plurality of display units. Each of the plurality of display units may display an image.

DISCLOSURE

Technical Problem

The present disclosure is directed to providing a connection bracket capable of facilitating a connection between a plurality of display units and a display apparatus including the same.

Further, the present disclosure is directed to providing a connection bracket capable of facilitating folding and/or tilting between a plurality of display units and a display apparatus including the same.

Further, the present disclosure is directed to providing a connection bracket including an improved structure to allow a plurality of display units to be arranged in various ways and a display apparatus including the same.

Further, the present disclosure is directed to providing a connection bracket with improved design aspects and a display apparatus including the same.

Technical Solution

Aspects of embodiments of the disclosure will be set forth in part in the description which follows and, in part, will be apparent from the description, or may be learned by practice of the presented embodiments.

According to an embodiment of the disclosure, a display apparatus includes a first display unit including a first connector; a second display unit including a second connector; and a connection bracket configured to connect the first display unit and the second display unit, wherein the connection bracket includes a first panel configured to be mounted on the first display unit, a third connector on the first panel and configured to be electrically connected to the first connector, a second panel configured to be mounted on the second display unit, a fourth connector on the second panel and configured to be electrically connected to the second connector, and a hinge configured to be slidable between the first panel and the second panel so as to adjust an angle between the first display unit and the second display unit while the first panel is mounted on the first display unit, the third connector is electrically connected to the first connector, the second panel is mounted on the second display unit, and the fourth connector is electrically connected to the second connector.

According to an embodiment of the disclosure, as the hinge slides, a length of the hinge is variable.

According to an embodiment of the disclosure, the hinge may include a first hinge portion extending from the first panel and a second hinge portion extending from the second panel. The first hinge portion and the second hinge portion are couplable together to be slidable relative to one another.

According to an embodiment of the disclosure, the hinge may include a hinge rail formed on one of the first hinge portion and the second hinge portion, and a hinge protrusion formed on the other of the first hinge portion and the second hinge portion and configured to be moved along the hinge rail when the first hinge portion and the second hinge portion are sliding relative to one another.

According to an embodiment of the disclosure, the hinge may include a hinge groove formed on one of the first hinge portion and the second hinge portion so as to be open toward the other of the first hinge portion and the second hinge portion, and a hinge protruding portion formed on the other of the first hinge portion and the second hinge portion and configured to be inserted into the hinge groove. The hinge protruding portion may be configured to be withdrawn from, and inserted into, the hinge groove.

According to an embodiment of the disclosure, the connection bracket may extend from a rear side of the first display unit to a rear side of the second display unit along a direction in which the first display unit and the second display unit are arranged.

According to an embodiment of the disclosure, the first display unit may include a first side adjacent to the second display unit and extending along a vertical direction, and a second side spaced apart from the first side and extending along the vertical direction. The second display unit may include a third side adjacent to the first side of the first display unit and extending along the vertical direction, and a fourth side spaced apart from the third side and extending along the vertical direction. A front edge of the first side and a front edge of the third side may come into contact with each other as the hinge slides.

According to an embodiment of the disclosure, the hinge may include a first hinge portion extending from the first panel and a second hinge portion extending from the second panel and coupled to the first hinge portion. Each of the first hinge portion and the second hinge portion may be rotatable with respect to a point where the front edge of the first side and the front edge of the third side come into contact with each other.

According to an embodiment of the disclosure, the first display unit may include a fifth connector closer to the second side than the first connector. The second display unit may include a sixth connector closer to the fourth side than the second connector. The connection bracket may include a seventh connector on the first panel and configured to be electrically connected to the fifth connector, and an eighth connector on the second panel and configured to be electrically connected to the sixth connector.

According to an embodiment of the disclosure, the first display unit may include a fifth connector closer to the second side than the first connector. The second display unit may include a sixth connector closer to the fourth side than the second connector. The first panel of the connection bracket may be configured to cover the first connector and the fifth connector. The second panel of the connection bracket may be configured to cover the second connector and the sixth connector.

According to an embodiment of the disclosure, the display apparatus may further include a third display unit including a fifth connector. The first display unit may include a sixth connector spaced apart from the first connector. The hinge may be a first hinge. The connection bracket may include a third panel configured to be mounted on the third display unit, a seventh connector on the third panel and configured to be electrically connected to the fifth connector, an eighth connector on the first panel and configured to be electrically connected to the sixth connector, and a second hinge configured to be slidable between the first panel and the third panel to adjust an angle between the first display unit and the third display unit while the first panel is mounted on the first display unit, the eighth connector is electrically connected to the sixth connector, the third panel is mounted on the third display unit, and the seventh connector is electrically connected to the fifth connector.

According to an embodiment of the disclosure, the connection bracket may include a position adjusting device configured to vertically move at least one of the third connector connected to the first connector and the fourth connector connected to the second connector.

According to an embodiment of the disclosure, the first display unit may include a first coupler. The second display unit may include a second coupler. The connection bracket may include a third coupler on the first panel and coupled to the first coupler, and a fourth coupler on the second panel and coupled to the second coupler.

According to an embodiment of the disclosure, the third connector and the fourth connector may be electrically connectable. The first display unit and the second display unit may be configured to transmit and receive at least one of power, control signals, and video signals through the connection bracket.

According to an embodiment of the disclosure, the connection bracket may include a first position adjusting device configured to vertically move the third connector connected to the first connector, and a second position adjusting device configured to vertically move the fourth connector connected to the second connector. While the first position adjusting device moves the third connector coupled to the first connector, a first gap may be formed between the first panel and the third connector so as to allow the third connector to be maintained in a state of being coupled to the first connector. While the second position adjusting device moves the fourth connector coupled to the second connector, a second gap may be formed between the second panel and the fourth connector so as to allow the fourth connector to be maintained in a state of being coupled to the second connector.

Another aspect of the present disclosure provides a connection bracket configured to connect a first display unit including a first connector to a second display unit disposed adjacent the first display unit and including a second connector. The connection bracket includes a first panel configured to be mounted on a rear side of the first display unit; a third connector formed on the first panel and configured to be electrically connected to the first connector; a second panel configured to be mounted on a rear side of the second display unit; a fourth connector formed on the second panel and configured to be electrically connected to the second connector; and a hinge configured to be slidable between the first panel and the second panel so as to allow a length of the hinge to vary.

DESCRIPTION OF DRAWINGS

These and/or other aspects of the disclosure will become apparent and more readily appreciated from the following description of embodiments, taken in conjunction with the accompanying drawings of which.

MODES OF THE INVENTION

Figure 1:
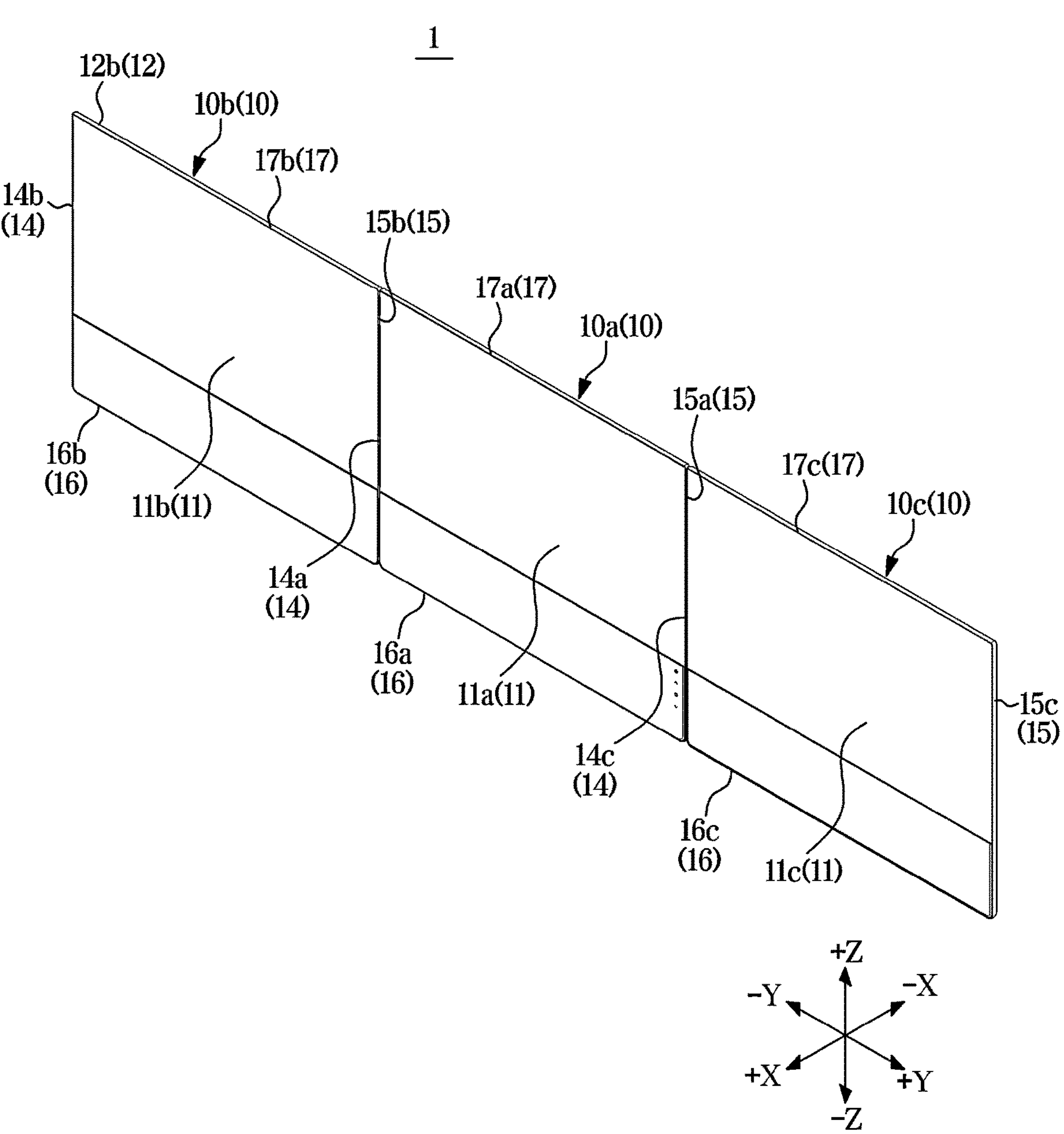
FIG. 1 is a perspective view of a display apparatus according to an embodiment of the disclosure.

The various embodiments and the terms used therein are not intended to limit the technology disclosed herein to specific forms, and the disclosure should be understood to include various modifications, equivalents, and/or alternatives to the corresponding embodiments.

In describing the drawings, similar reference numerals may be used to designate similar constituent elements.

A singular expression may include a plural expression unless otherwise indicated herein or clearly contradicted by context.

The expressions "A or B," "at least one of A or/and B," or "one or more of A or/and B," A, B or C," "at least one of A, B or/and C," or "one or more of A, B or/and C," and the like used herein may include any and all combinations of one or more of the associated listed items.

The expression "at least one of A and/or B" should be understood to represent "A" or "B" or any one of "A and B."

For example, the expression "at least one of A and B" includes any of the following: A, B, A and B. The expression "at least one of A, B, and C" includes any of the following: A, B, C, A and B, A and C, B and C, A and B and C.

The term of "and/or" includes a plurality of combinations of relevant items or any one item among a plurality of relevant items.

Terms such as "unit", "module", "member", and "block" may be embodied as hardware or software. According to embodiments, a plurality of "unit", "module", "member", and "block" may be implemented as a single component or a single "unit", "module", "member", and "block" may include a plurality of components.

Herein, the expressions "a first", "a second", "the first", "the second", etc., may simply be used to distinguish an element from other elements, but is not limited to another aspect (importance or order) of elements.

When an element (e.g., a first element) is referred to as being "(functionally or communicatively) coupled," or "connected" to another element (e.g., a second element), the first element may be connected to the second element, directly (e.g., wired), wirelessly, or through a third element.

In this disclosure, the terms "including", "having", and the like are used to specify features, numbers, steps, operations, elements, components, or combinations thereof, but do not preclude the presence or addition of one or more of the features, numbers, steps, operations, elements, components or combinations thereof.

When an element is said to be "connected", "coupled", "supported" or "contacted" with another element, this includes not only when elements are directly connected, coupled, supported or contacted, but also when elements are indirectly connected, coupled, supported or contacted through a third element.

Throughout the description, when an element is "on" another element, this includes not only when the element is in contact with the other element, but also when there is another element between the two elements.

Hereinafter exemplary embodiments of the present disclosure will be described in detail with reference to the accompanying drawings The terms "forward and backward direction", "forward," "backward," "lateral direction", "horizontal direction", "right side", "left side", "up and down direction", "vertical direction", "upward," "downward," etc. used in the following description may be defined based on the drawings. For example, based on a display apparatus 1 shown in FIG. 1, a direction in which an image is displayed may be defined as the forward direction (+X direction), and a side opposite to the front may be defined as the backward direction (−X direction). For example, a direction in which the plurality of display units 10 is arranged based on the display apparatus 1 shown in FIG. 1 may be defined as the lateral (or horizontal) direction (Y direction). However, the shape and location of each component are not limited by the above-mentioned terms.

Hereinafter for convenience of description, a display unit 10 included in the display apparatus 1 will be described using a monitor as an example. However, the display unit 10 of the present disclosure is not limited to a monitor. For example, the display unit 10 of the present disclosure may also be applied to devices such as TVs, smart phones, and tablet PCs.

In addition, the drawing shows the display apparatus 1 including the flat display unit 10 as an example, but the present disclosure is not limited thereto. The present disclosure may also be applied to a curved display unit or a bendable or flexible display unit in which a flat state and a curved state are variable.

Figure 2:
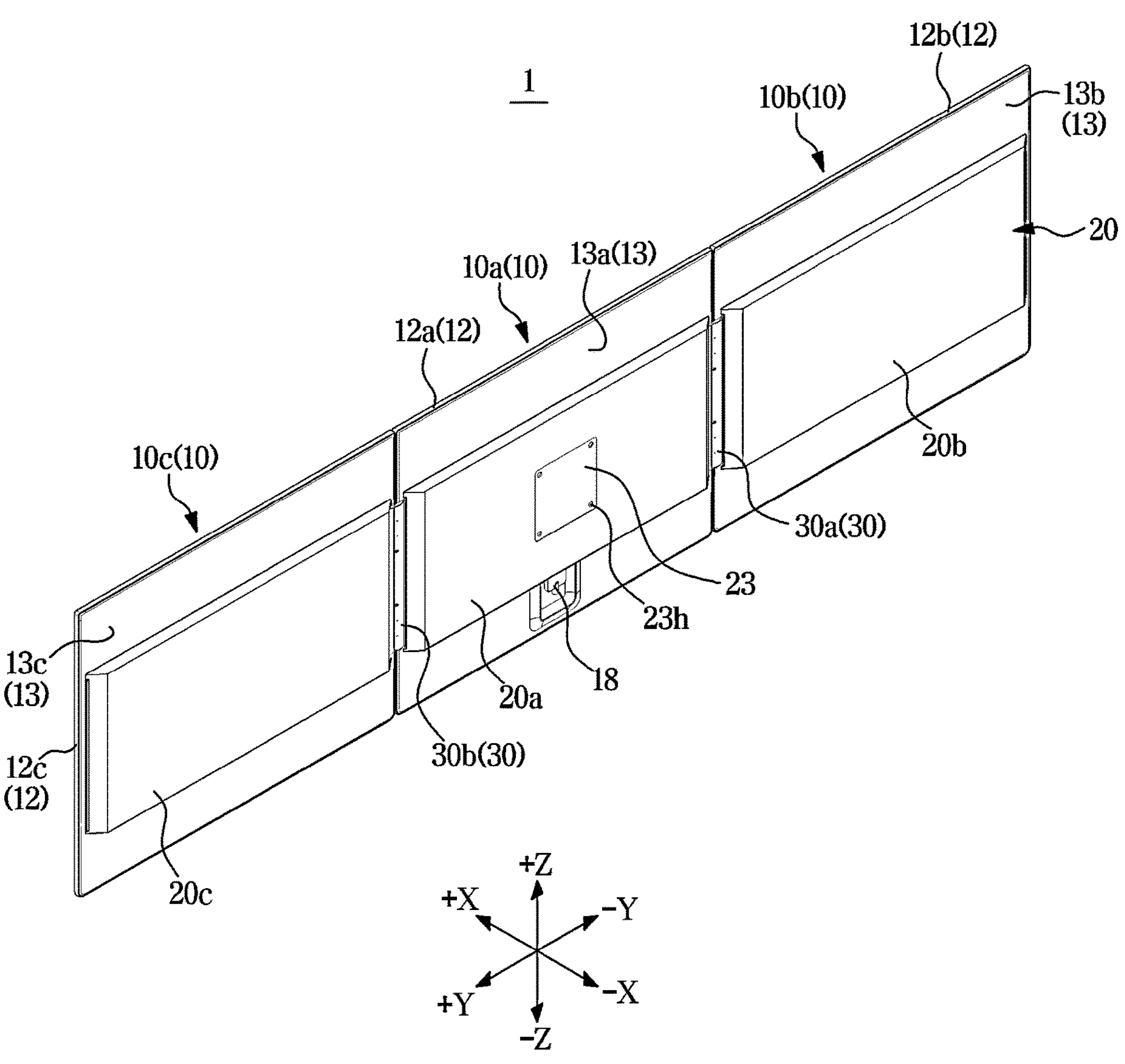
FIG. 2 is a rear perspective view of the display apparatus shown in FIG. 1.

FIG. 1 is a perspective view of a display apparatus according to one embodiment. FIG. 2 is a rear perspective view of the display apparatus shown in FIG. 1.

Referring to FIGS. 1 and 2, the display apparatus 1 may include a plurality of display units 10 and a connection bracket 20.

The display apparatus 1 may include a plurality of display units 10. The display apparatus 1 may include at least two display units 10.

For example, the display apparatus 1 may include a first display unit 10*a* and a second display unit 10*b* disposed adjacent to one side of the first display unit 10*a*. For example, the display apparatus 1 may include a first display unit 10*a*, a second display unit 10*b* disposed adjacent to one side of the first display unit 10*a*, and a third display unit 10*c* disposed adjacent to the other side of the first display unit 10*a*.

For example, for convenience of description, the display unit 10*a* disposed in the center among the plurality of display units 10 may be defined as the first display unit 10*a*. Additionally, the second display unit 10*b* and the third display unit 10*c* may be defined based on the first display unit 10*a*. For example, the display unit 10*b* disposed on the left side of the first display unit 10*a* may be defined as the second display unit 10*b*, and the display unit 10*c* disposed on the right side of the first display unit 10*a* may be defined as the third display unit 10*c*. However, the ordinal numbers of "first", "second", and "third" do not limit the configuration of the first display unit 10*a*, the second display unit 10*b*, and the third display unit 10*c*.

Additionally, it is illustrated that the display apparatus 1 includes three display units 10*a*, 10*b*, and 10*c* on the drawings, but the present disclosure is not limited thereto.

The display apparatus 1 may include four or more display units. The display apparatus 1 may include two display units.

The display unit 10 may have different horizontal and vertical side lengths. That is, the display unit 10 may be provided to have a long side and a short side. Each display unit 10 may be provided in a rectangular plate shape. However, the present disclosure is not limited thereto, and the display unit 10 may be provided in a square plate shape with long and short sides having the same length. Alternatively, the display unit 10 may be provided in various sizes.

For example, the display unit 10 may include a first side 14 extending along a substantially vertical direction (Z direction), and a second side 15 spaced apart from the first side 14 and extending along the substantially vertical direction (Z direction). The first side 14 and the second side 15 may be spaced apart in the lateral direction (Y direction). The first side 14 and the second side 15 may be provided with short sides. For example, the display unit 10 may include a third side 16 extending along the substantially lateral direction (Y direction) and a fourth side 17 spaced apart from the third side 16 and extending along the substantially lateral direction (Y direction). The third side 16 may connect a lower end of the first side 14 and a lower end of the second side 15. The fourth side 17 may connect an upper end of the first side 14 and an upper end of the second side 15. The third side 16 and the fourth side 17 may be spaced apart in the up and down direction (Z direction). The third side 16 and the fourth side 17 may be provided with long sides. The third sides 16*a*, 16*b*, and 16*c*, and the fourth sides 17*a*, 17*b*, and 17*c* correspond to the display units 10*a*, 10*b*, and 10*c*. The ordinal numbers of "first", "second", and "third" do not limit the configuration of the first side 14, the second side 15, the third side 16, and the fourth side 17.

Based on the description above, a first side 14*a* of the first display unit 10*a* may be adjacent to a second side 15*b* of the second display unit 10*b*. Based on the description above, a second side 15*a* of the first display unit 10*a* may be adjacent to a first side 14*c* of the third display unit 10*c*.

The display unit 10 may receive content data including video signals and audio signals from various content sources and output video and audio corresponding to the video signals and the audio signals. For example, the display unit 10 may receive content data through a broadcast reception antenna or cable, receive content data from a content playback device, or receive content data from a content providing server of a content provider.

The display unit 10 may be configured to display a screen. The display unit 10 may include a display panel 11 provided to display an image on a front surface. For example, the front surface of the display unit 10 may form a front surface of the display apparatus 1.

A screen display area may be formed on the front surface of the display panel 11. The screen may be displayed in front of the display panel 11. A plurality of pixels may be formed in the screen display area, and the screen displayed on the screen display area may be formed by a combination of light emitted from the plurality of pixels. For example, a single screen may be formed on the screen display area by combining light emitted from the plurality of pixels like a mosaic.

Each of the plurality of pixels may emit light of various brightnesses and colors. Particularly, each of the plurality of pixels may include sub-pixels. The sub-pixels may include a red sub-pixel capable of emitting red light, a green sub-pixel capable of emitting green light, and a blue sub-pixel capable of emitting blue light. Each of the plurality of pixels may emit light of various brightnesses and colors by combining the light emitted from the red sub-pixel, the green sub-pixel, and the blue sub-pixel.

The display panel 11 may be a self-luminous display panel such as an organic light-emitting diode (OLED) or a non-self-luminous display panel such as a liquid crystal display (LCD). There is no particular limitation on the type of display panel 11, and each display unit 10 may include various types of display panels 11.

When the display panel 11 is an LCD panel, the display panel 11 may include a thin film transistor substrate in which thin film transistors (TFTs) are formed in a matrix form, a color filter substrate coupled in parallel with the thin film transistor substrate, and a liquid crystal injected between the thin film transistor substrate and the color filter substrate and having optical properties that vary depending on changes in voltage or temperature. Additionally, a back light unit (BLU) (not shown) may be provided inside a case 12. The backlight unit may be disposed behind the display panel 11 to emit light toward the display panel 11. At this time, the display panel 11 may block or pass the light emitted from the backlight unit. However, the present disclosure is not limited thereto, and as described above, the display panel 11 may be a self-luminous display panel such as an OLED panel.

The first display unit 10*a* may include a first display panel 11*a*. The second display unit 10*b* may include a second display panel 11*b*. The third display unit 10*c* may include a third display panel 11*c*. However, the ordinal numbers of "first", "second", and "third" do not limit the configuration of the first display panel 11*a*, the second display panel 11*b*, and the third display panel 11*c*.

The display unit 10 may include the case 12 provided to accommodate the display panel 11. The case 12 may form at least a part of the exterior of display unit 10. Components for the display unit 10 to display images or to perform various functions, such as the display panel 11 may be accommodated in the case 12.

The case 12 may be provided to support and/or fix the display panel 11. The case 12 may be provided to cover a rear surface of the display panel 11. For example, a rear surface of the case 12 may form a rear surface of the display apparatus 1.

For example, the case 12 may be provided in the form of an assembly in which a plurality of components is coupled.

The case 12 may be referred to as a chassis, frame, mold, cover, etc.

The first display unit 10*a* may include a first case 12*a*. The second display unit 10*b* may include a second case 12*b*. The third display unit 10*c* may include a third case 12*c*. However, the ordinal numbers of "first", "second", and "third" do not limit the configuration of the first case 12*a*, the second case 12*b*, and the third case 12*c*.

A port 18 provided to receive power and/or signals from the outside may be formed in one of the plurality of display units 10. For example, the port 18 may be formed at a rear 13*a* of the first display unit 10*a*. As will be described later, the plurality of display units 10 may be electrically connected to each other by the connection bracket 20. As a result, the port 18 may not be formed in each of the plurality of display units 10. That is, the display unit 10*a*, in which the port 18 is formed, and the display unit 10*b* or 10*c*, in which the port 18 is not formed, may share power and/or signals (e.g., video signals and control signals) through the connection bracket 20. As a result, the number of ports 18 and the number of cables connected to the port 18 may be reduced. The display apparatus 1 may have an elegant appearance. However, according to embodiments, the port 18 may be formed in each of the plurality of display units 10 or in some of the plurality of display units 10.

The display apparatus 1 may include the connection bracket 20. The connection bracket 20 may be configured to connect the plurality of display units 10. For example, when the display apparatus 1 includes the first display unit 10*a* and the second display unit 10*b*, the connection bracket 20 may be configured to connect the first display unit 10*a* and the second display unit 10*b*. For example, when the display apparatus 1 includes the first display unit 10*a*, the second display unit 10*b*, and the third display unit 10*c*, the connection bracket 20 may be configured to connect the first display unit 10*a*, the second display unit 10*b*, and the third display unit 10*c*.

The connection bracket 20 may be detachably coupled to a rear 13 of the plurality of display units 10. The connection bracket 20 may be provided to cover the rear 13 of the plurality of display units 10.

The connection bracket 20 may be provided to extend along a direction in which the plurality of display units 10 is arranged. For example, when the display apparatus 1 includes the first display unit 10*a* and the second display unit 10*b*, the connection bracket 20 may extend from the rear 13*a* of the first display unit 10*a* to a rear 13*b* of the second display unit 10*b* along a direction in which the first display unit 10*a* and the second display unit 10*b* are arranged. For example, when the display apparatus 1 includes the first display unit 10*a*, the second display unit 10*b*, and the third display unit 10*c*, the connection bracket 20 may extend from the rear 13*b* of the second display unit 10*b* to a rear 13*c* of the third display unit 10*c* along a direction in which the first display unit 10*a*, the second display unit 10*b*, and the third display unit 10*c* are arranged.

Figure 3:
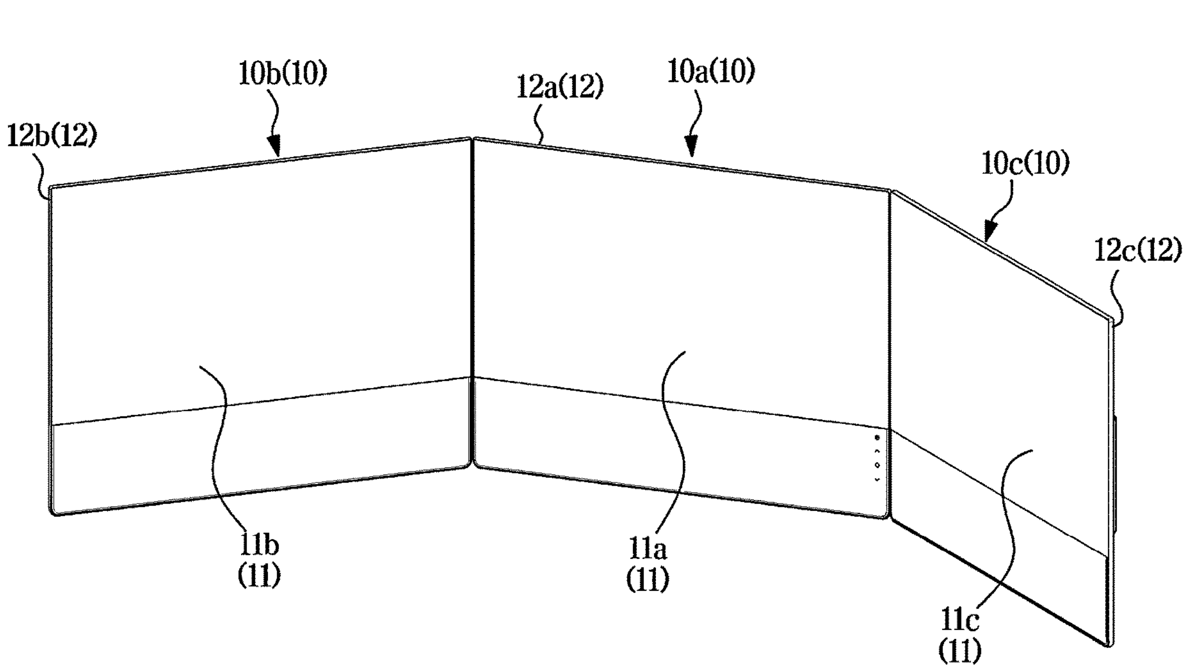
FIG. 3 is a perspective view illustrating an example of the display apparatus shown in FIG. 1 in a folded state.
Figure 4:
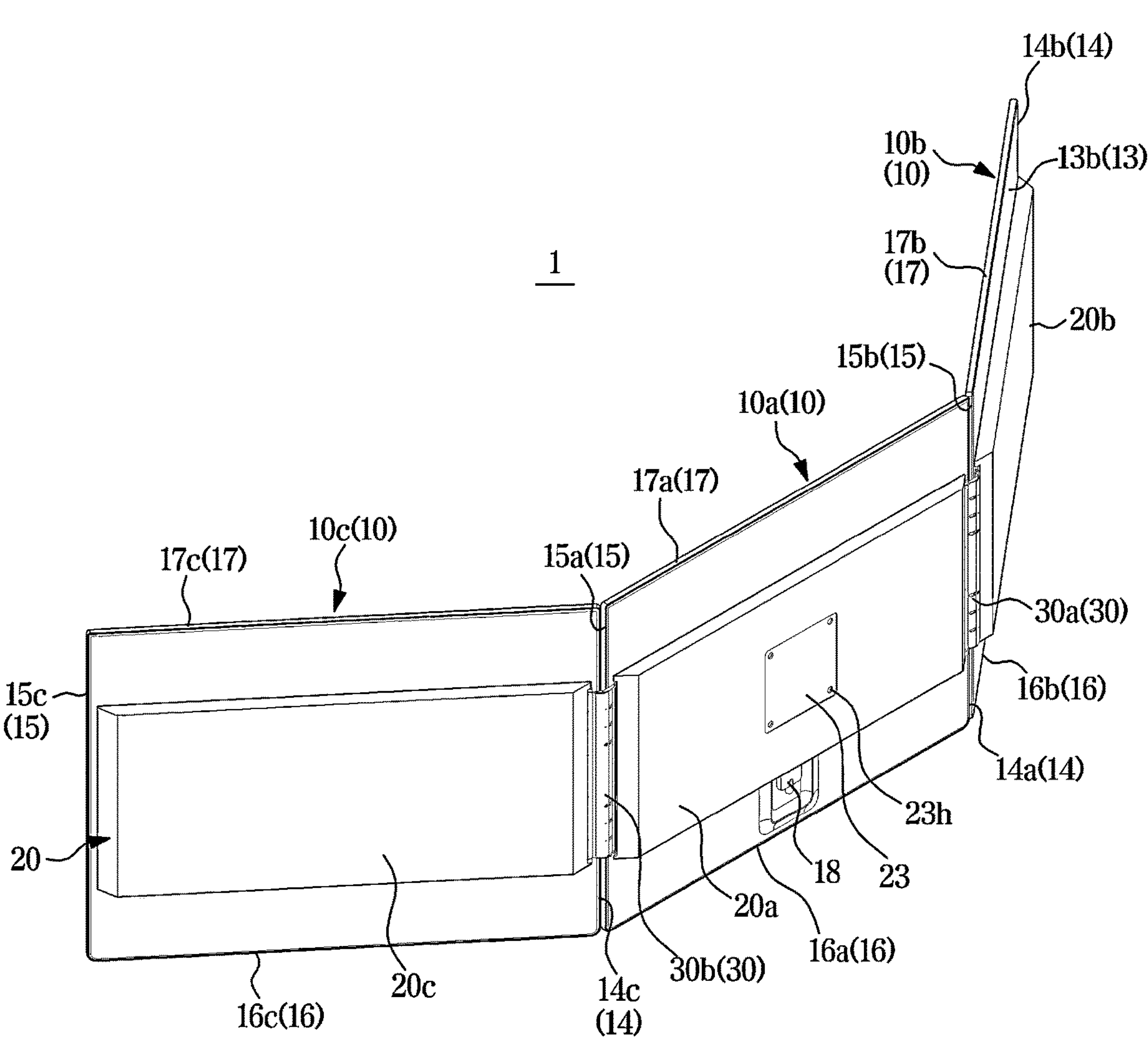
FIG. 4 is a rear perspective view of the display apparatus shown in FIG. 3.

FIG. 3 is a perspective view illustrating an example of the display apparatus shown in FIG. 1 in a folded state. As illustrated in FIG. 3, the term "folded" may indicate a lateral axis of a first display unit 10*a* may be angled relative to the respective lateral axes of the adjacent second display unit 10*b* and the adjacent third display unit 10*c* when the display units are arranged side by side as shown. FIG. 4 is a rear perspective view of the display apparatus shown in FIG. 3.

An angle between the display units 10 adjacent to each other among the plurality of display units 10 may vary. The display units 10 adjacent to each other among the plurality of display units 10 may be arranged to be foldable and/or tiltable.

The display units 10 adjacent to each other may be arranged to be foldable and/or tiltable by a hinge 30 of the connection bracket 20. An angle between the display units 10 adjacent to each other may be adjusted by the hinge 30 of the connection bracket 20. A description thereof will be described.

On the drawing, it is illustrated that the second display unit 10*b* is folded and/or tilted within a predetermined range with respect to the first display unit 10*a*, and the third display unit 10*c* is folded and/or tilted within a predetermined range with respect to the first display unit 10*a*. However, the present disclosure is not limited thereto. Alternatively, the first display unit 10*a* may be folded and/or tilted within a predetermined range with respect to the second display unit 10*b*. Alternatively, the first display unit 10*a* may be folded and/or tilted within a predetermined range with respect to the third display unit 10*c*.

Figure 5:
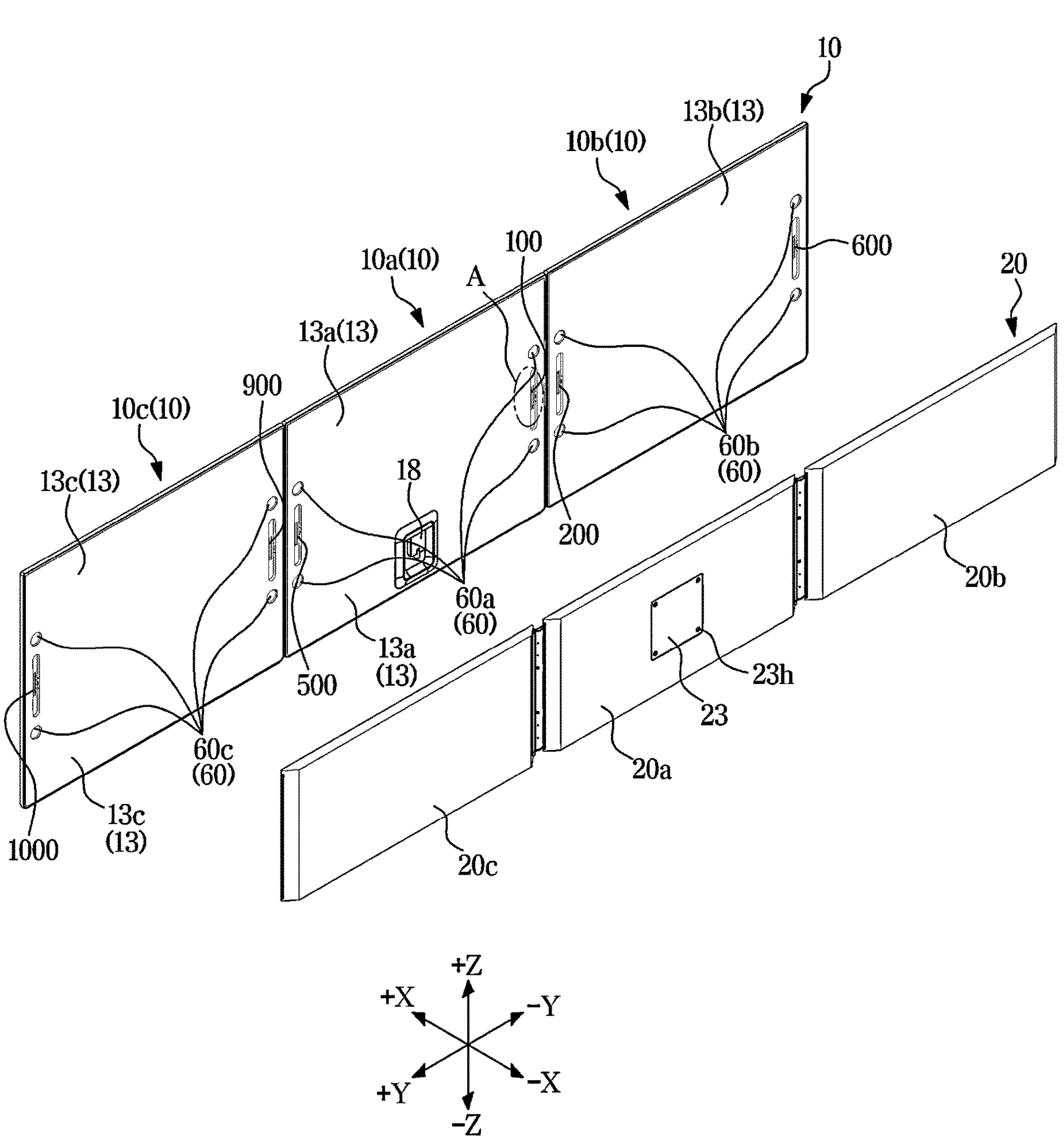
FIG. 5 illustrates a state in which a plurality of display units and a connection bracket according to an embodiment of the disclosure are separated from each other.
Figure 6:
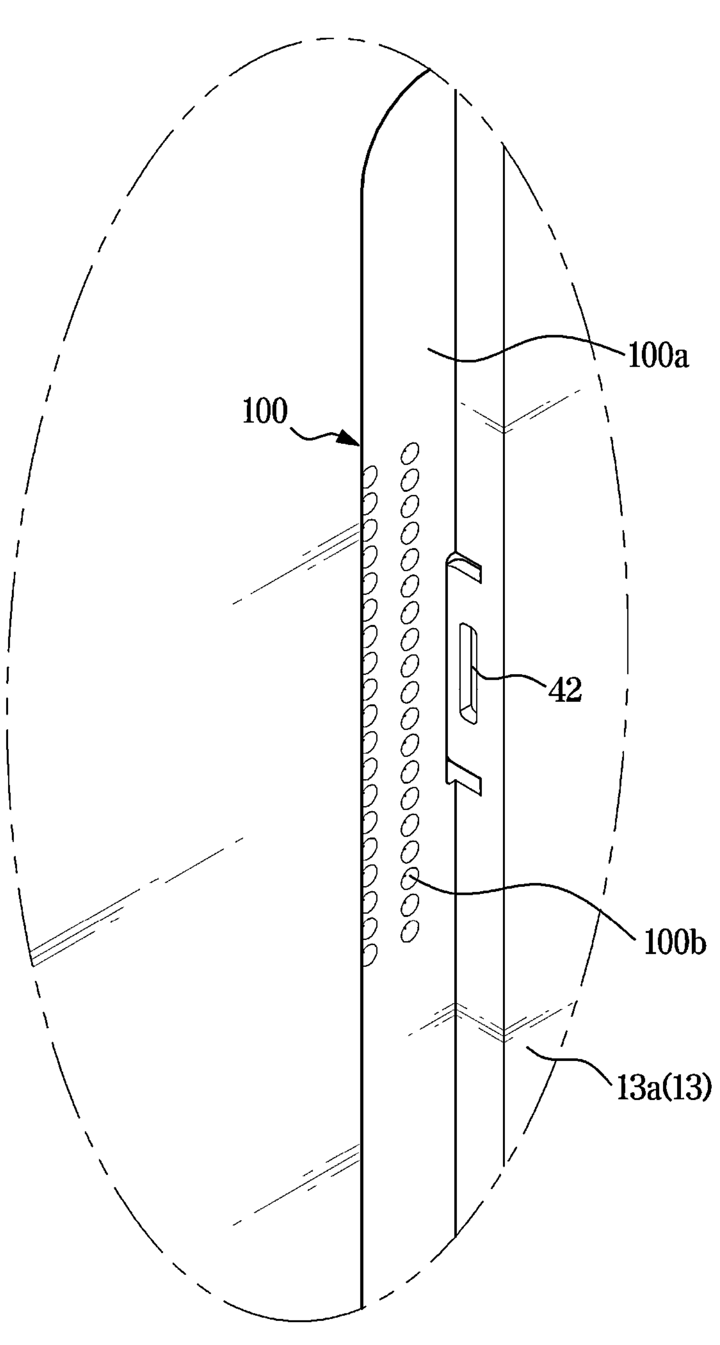
FIG. 6 is an enlarged view of part A shown in FIG. 5.
Figure 7:
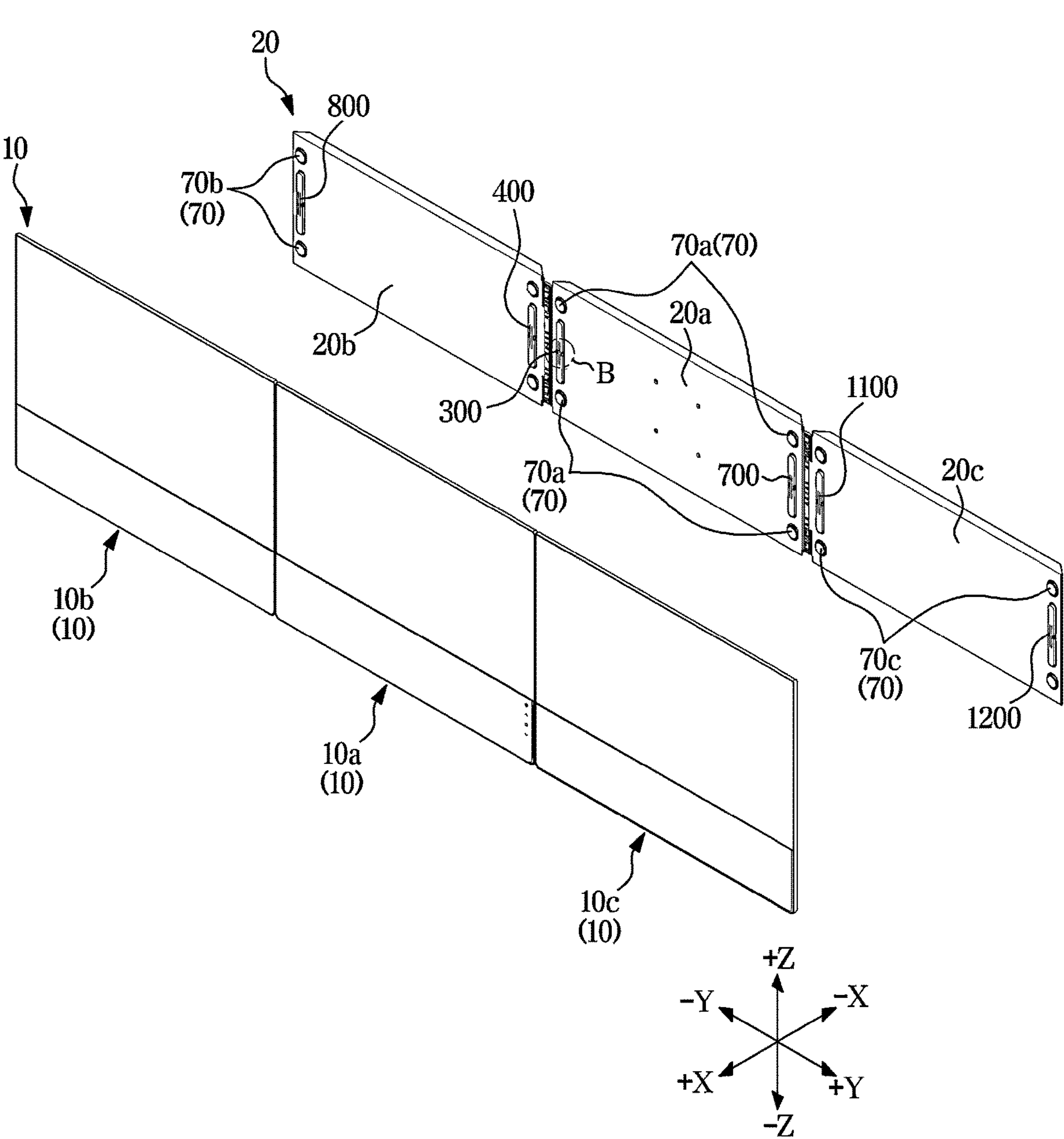
FIG. 7 illustrates the plurality of display units and the connection bracket shown in FIG. 5 when viewed from another direction.
Figure 8:
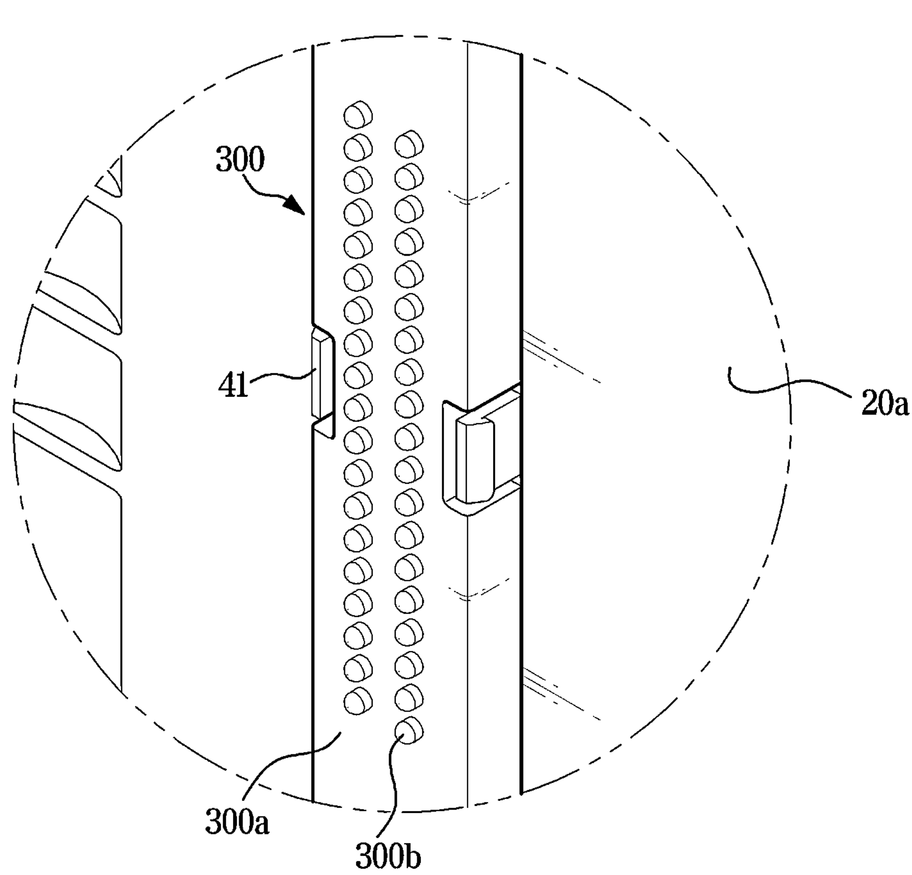
FIG. 8 is an enlarged view of part B shown in FIG. 7.

FIG. 5 illustrates a state in which a plurality of display units and a connection bracket according to one embodiment are separated from each other. FIG. 6 is an enlarged view of part A shown in FIG. 5. FIG. 7 illustrates the plurality of display units and the connection bracket shown in FIG. 5 when viewed from another direction. FIG. 8 is an enlarged view of part B shown in FIG. 7.

Each of the plurality of display units 10 may include at least one connector. The at least one connector may be formed at the rear 13 of each of the plurality of display units 10. For example, the display unit 10 may include two connectors adjacent to both sides 14 and 15, respectively. For example, the display unit 10 may include two connectors extending along each of both sides 14 and 15.

The connection bracket 20 may include connectors corresponding to each connector of the plurality of display units 10. The connection bracket 20 may include a connector configured to be electrically connected to each connector of the plurality of display units 10. The connection bracket 20 may include panels 20*a*, 20*b*, and 20*c* mounted on each of the plurality of display units 10. The number of panels of the connection bracket 20 may be the same as the number of display units 10.

For example, the connector of the display unit 10 and the connector of the connection bracket 20 may be connected using a pogo pin method. However, this is only an example, and the connector of the plurality of display units 10 and the connector of the connection bracket 20 may be electrically connected through various known methods.

Meanwhile, connectors 100, 200, 500, 600, 900 and/or 1000 formed on the display unit 10 may be referred to as display side connectors 100, 200, 500, 600, 900 and/or 1000. Connectors 300, 400, 700 and/or 800, 1100 and/or 1200 formed on the connection bracket 20 may be referred to as bracket side connectors 300, 400, 700 and/or 800, 1100 and/or 1200.

Hereinafter an example in which the display apparatus 1 includes the first display unit 10*a* and the second display unit 10*b* will be described. The description of the first display unit 10*a* and the second display unit 10*b* corresponds to an example of a description of the adjacent display units among the plurality of display units 10. Accordingly, the description of the first display unit 10*a*, and the second display unit 10*b* may be equally applied to the first display unit 10*a* and the third display unit 10*c*. In addition, when the display apparatus 1 includes four or more display units 10, a description of the first display unit 10*a* and the second display unit 10*b* may be equally applied to display units adjacent to each other among the plurality of display units.

The first display unit 10*a* may include a first connector 100. The first connector 100 may be formed at the rear 13*a* of the first display unit 10*a*. For example, the first connector 100 may be disposed adjacent to the first side 14*a* of the first display unit 10*a*. For example, the first connector 100 may have a shape extending along the substantially vertical direction (Z direction).

The second display unit 10*b* may include a second connector 200. The second connector 200 may be formed at the rear 13*b* of the second display unit 10*b*. For example, the second connector 200 may be disposed adjacent to the second side 15*b* of the second display unit 10*b*. For example, the second connector 200 may have a shape extending along the substantially vertical direction (Z direction).

The connection bracket 20 may include a first panel 20*a* configured to be mounted on the first display unit 10*a*. The first panel 20*a* may be mounted on the rear 13*a* of the first display unit 10*a*. The first panel 20*a* may extend along the substantially lateral direction (Y direction) between the first side 14*a* and the second side 15*a* of the first display unit 10*a*. The first panel 20*a* may extend between both sides 14*a* and

15*a* of the first display unit 10*a*, along the direction in which the first display unit 10*a* and the second display unit 10*b* are arranged.

The connection bracket 20 may include a second panel 20*b* configured to be mounted on the second display unit 10*b*. The second panel 20*b* may be mounted on the rear 13*b* of the second display unit 10*b*. The second panel 20*b* may extend along the substantially lateral direction (Y direction) between the first side 14*b* and the second side 15*b* of the second display unit 10*b*. The second panel 20*b* may extend between both sides 14*b* and 15*b* of the second display unit 10*b*, along the direction in which the first display unit 10*a* and the second display unit 10*b* are arranged.

The connection bracket 20 may include a third connector 300 formed on the first panel 20*a* and configured to be electrically connected to the first connector 100. The third connector 300 may have a shape corresponding to the first connector 100. For example, the first connector 100 and the third connector 300 may be configured to transmit and receive power and/or signals (e.g., video signals and control signals).

The connection bracket 20 may include a fourth connector 400 formed on the second panel 20*b* and configured to be electrically connected to the second connector 200. The fourth connector 400 may have a shape corresponding to the second connector 200. For example, the second connector 200 and the fourth connector 400 may be configured to transmit and receive power and/or signals (e.g., video signals and control signals).

The third connector 300 and the fourth connector 400 of the connection bracket 20 may be electrically connected. For example, the third connector 300 and the fourth connector 400 may be electrically connected through an electronic circuit, a cable 21 (refer to FIG. 16), etc. For example, the third connector 300 and the fourth connector 400 may be configured to transmit and receive power and/or signals (e.g., video signals and control signals).

As the connection bracket 20 is mounted on the first display unit 10*a* and the second display unit 10*b*, the first connector 100 and the third connector 300 may be electrically connected, and the second connector 200 and the fourth connector 400 may be electrically connected. Additionally, the third connector 300 and the fourth connector 400 of the connection bracket 20 may be electrically connected. As a result, the first display unit 10*a* and the second display unit 10*b* may exchange power and/or signals with each other through the connection bracket 20. The first display unit 10*a* and the second display unit 10*b* may be configured to transmit and receive at least one of power, control signals, or video signals through the connection bracket 20. The first display unit 10*a* and the second display unit 10*b* may be configured to share various information. The first display unit 10*a* may include a fifth connector 500. The fifth connector 500 may be formed at the rear 13*a* of the first display unit 10*a*. The fifth connector 500 may be spaced apart from the first connector 100 in the lateral direction (Y direction). The fifth connector 500 may be arranged closer to the second side 15*a* of the first display unit 10*a* than the first connector 100. For example, the fifth connector 500 may have a shape extending along the substantially vertical direction (Z direction).

The first connector 100 and the fifth connector 500 may be disposed adjacent to each of both sides 14*a* and 15*a* of the first display unit 10*a*.

The second display unit 10*b* may include a sixth connector 600. The sixth connector 600 may be formed at the rear 13*b* of the second display unit 10*b*. The sixth connector 600 may be spaced apart from the second connector 200. The sixth connector 600 may be disposed closer to the first side 14*b* of the second display unit 10*b* than the second connector 200. For example, the sixth connector 600 may have a shape extending along the substantially vertical direction (Z direction).

The second connector 200 and the sixth connector 600 may be disposed adjacent to each of both sides 15*b* and 14*b* of the second display unit 10*b*.

The connection bracket 20 may include a seventh connector 700 formed on the first panel 20*a* and configured to be electrically connected to the fifth connector 500. The seventh connector 700 may have a shape corresponding to the fifth connector 500. The seventh connector 700 may be spaced apart from the third connector 300 in the lateral direction (Y direction). For example, the fifth connector 500 and the seventh connector 700 may be configured to transmit and receive power and/or signals (e.g., video signals and control signals).

The third connector 300 and the seventh connector 700 may be disposed adjacent to each of both sides of the first panel 20*a*.

The connection bracket 20 may include an eighth connector 800 formed on the second panel 20*b* and electrically connected to the sixth connector 600. The eighth connector 800 may have a shape corresponding to the sixth connector 600. The eighth connector 800 may be spaced apart from the fourth connector 400 in the lateral direction (Y direction). For example, the sixth connector 600 and the eighth connector 800 may be configured to transmit and receive power and/or signals (e.g., video signals and control signals).

The fourth connector 400 and the eighth connector 800 may be disposed adjacent to each of both sides of the second panel 20*b*.

The first panel 20*a* of the connection bracket 20 may have an extended shape to cover the first connector 100 and the fifth connector 500. The second panel 20*b* of the connection bracket 20 may have an extended shape to cover the second connector 200 and the sixth connector 600.

An example in which the display apparatus 1 includes a first display unit 10*a*, a second display unit 10*b*, and a third display unit 10*c* will be described. As described above, the contents of the first display unit 10*a* and the second display unit 10*b* may be equally applied to the first display unit 10*a* and the third display unit 10*c*, and a description the same as the above description may be omitted.

The third display unit 10*c* may include a ninth connector 900. The ninth connector 900 may be formed at the rear 13*c* of the third display unit 10*c*. For example, the ninth connector 900 may be disposed adjacent to the first side 14*c* of the third display unit 10*c*. For example, the ninth connector 900 may have a shape extending along the substantially vertical direction (Z direction).

The third display unit 10*c* may include a tenth connector 1000. The tenth connector 1000 may be formed at the rear 13*c* of the third display unit 10*c*. The tenth connector 1000 may be spaced apart from the ninth connector 900 in the lateral direction (Y direction). For example, the tenth connector 1000 may be disposed adjacent to the second side 15*c* of the third display unit 10*c*. For example, the tenth connector 1000 may have a shape extending along the substantially vertical direction (Z direction).

The ninth connector 900 and the tenth connector 1000 may be disposed adjacent to each of both sides 14*c* and 15*c* of the third display unit 10*c*.

The connection bracket 20 may include a third panel 20*c* configured to be mounted on the third display unit 10*c*. The third panel 20*c* may be mounted on the rear 13*c* of the third display unit 10*c*. The third panel 20*c* may extend along the substantially lateral direction (Y direction) between the first side 14*c* and the second side 15*c* of the third display unit 10*c*. The third panel 20*c* may extend between both sides 14*c* and 15*c* of the third display unit 10*c*, along the direction in which the first display unit 10*a* and the third display unit 10*c* are arranged.

The connection bracket 20 may include an eleventh connector 1100 formed on the third panel 20*c* and electrically connected to the ninth connector 900. The eleventh connector 1100 may have a shape corresponding to the ninth connector 900. For example, the ninth connector 900 and the eleventh connector 1100 may be configured to transmit and receive power and/or signals (e.g., video signals and control signals).

The connection bracket 20 may include a twelfth connector 1200 formed on the third panel 20*c* and electrically connected to the tenth connector 1000. The twelfth connector 1200 may have a shape corresponding to the tenth connector 1000. The twelfth connector 1200 may be spaced apart from the eleventh connector 1100 in the lateral direction (Y direction). For example, the tenth connector 1000 and the twelfth connector 1200 may be configured to transmit and receive power and/or signals (e.g., video signals and control signals).

The eleventh connector 1100 and the twelfth connector 1200 may be disposed adjacent to each of both sides of the third panel 20*c*.

The seventh connector 700 and the eleventh connector 1100 of the connection bracket 20 may be electrically connected. For example, the seventh connector 700 and the eleventh connector 1100 may be electrically connected through an electronic circuit, a cable 21 (refer to FIG. 16), etc. For example, the seventh connector 700 and the eleventh connector 1100 may be configured to transmit and receive power and/or signals (e.g., video signals and control signals). As the connection bracket 20 is mounted on the first display unit 10*a* and the third display unit 10*c*, the fifth connector 500 and the seventh connector 700 may be electrically connected, and the ninth connector 900 and the eleventh connector 1100 may be electrically connected. Additionally, the seventh connector 700 and the eleventh connector 1100 of the connection bracket 20 may be electrically connected. As a result, the first display unit 10*a* and the third display unit 10*c* may exchange power and/or signals with each other through the connection bracket 20. The first display unit 10*a* and the third display unit 10*c* may be configured to transmit and receive at least one of a control signal or a video signal through the connection bracket 20. The first display unit 10*a* and the third display unit 10*c* may be configured to share various information.

The first connector 100 will be described as an example of the display side connector with reference to FIG. 6. A description of the first connector 100 shown in FIG. 6 may be applied to the second connector 200, the fifth connector 500, the sixth connector 600, the ninth connector 900, and the tenth connector 1000.

The first connector 100 may include a connector body 100*a* and a connector terminal 100*b* formed on the connector body 100*a*. For example, the connector body 100*a* may have a shape recessed from the rear 13*a* of the first display unit 10*a*. For example, the connector terminal 100*b* may be formed of a conductive material to transmit electrical signals and/or current.

The first connector 100 may include a connector hook groove 42. The connector hook groove 42 of the first connector 100 may be coupled to a connector hook 41 of the third connector 300, which will be described later. Accordingly, the first connector 100 and the third connector 300 may be connected more stably. For example, at least one connector hook groove 42 may be provided.

Each of the second connector 200, the fifth connector 500, the sixth connector 600, the ninth connector 900, and the tenth connector 1000 may include substantially the same configuration as the first connector 100.

The third connector 300 will be described as an example of the bracket side connector with reference to FIG. 8. A description of the third connector 300 shown in FIG. 8 may be applied to the fourth connector 400, the seventh connector 700, the eighth connector 800, the eleventh connector 1100 and the twelfth connector 1200.

The third connector 300 may include a connector body 300*a* and a connector terminal 300*b* formed on the connector body 300*a*. The connector body 300*a* may have a shape corresponding to the connector body 100*a*. For example, the connector body 300*a* may have a shape that protrudes from the first panel 20*a*. However, the present disclosure is not limited thereto. For example, the connector body 100*a* may have a shape that protrudes toward the connector body 300*a*, and the connector body 300*a* may have a recessed shape to correspond to the connector body 100*a*. For example, the connector terminal 300*b* may be formed of a conductive material to transmit electrical signals and/or current. For example, the connector terminal 300*b* may be provided to be in contact with the connector terminal 100*a*.

The third connector 300 may include a connector hook 41. The connector hook 41 of the third connector 300 may be coupled to the connector hook groove 42 of the first connector 100. Accordingly, the first connector 100 and the third connector 300 may be connected more stably. For example, at least one connector hook 41 may be provided. Meanwhile, contrary to the drawing, the first connector 100 may include a connector hook, and the third connector 300 may include a connector hook groove.

Figure 10:
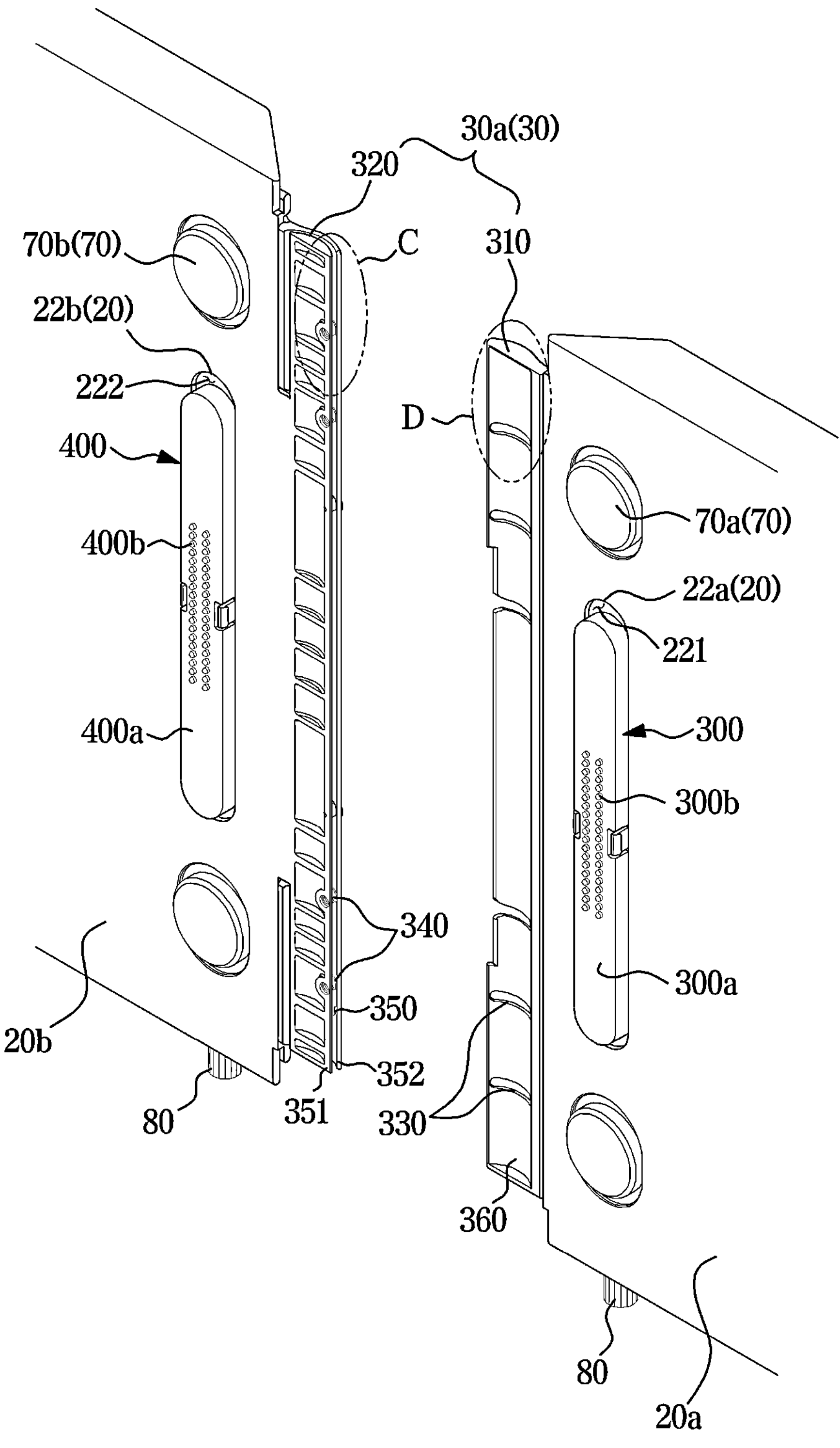
FIG. 10 is an exploded view of a portion of the connection bracket shown in FIG. 9.

Each of the fourth connector 400, the seventh connector 700, the eighth connector 800, the eleventh connector 1100, and the twelfth connector 1200 may have substantially the same configuration as the third connector 300. For example, as shown in FIG. 10 (described herein), the fourth connector includes a connector body 400*a* and a connector terminal 400*b*.

The display side connectors 100, 200, 500, 600, 900 and/or 1000 and the bracket side connectors 300, 400, 700, 800, 1100 and/or 1200 may have shapes that correspond to each other. Accordingly, the connection bracket 20 may be easily mounted on the plurality of display units 10. The connection bracket 20 may be accurately mounted on the plurality of display units 10. Additionally, the bracket side connector and the display side connector may be connected more reliably. In the drawing, it is illustrated that the display side connectors 100, 200, 500, 600, 900 and/or 1000 have a recessed shape, and the bracket side connectors 300, 400, 700, 800, 1100 and/or 1200 have a protruding shape, but the present disclosure is not limited thereto. For example, the display side connectors 100, 200, 500, 600, 900 and/or 1000 may have a protruding shape, and the bracket side connectors 300, 400, 700, 800, 1100 and/or 1200 may have a recessed shape. For example, a portion of the display side connectors may have a protruding shape, and a portion of the bracket side connectors corresponding to the portion of the display side connector may have a recessed shape. For example, the remaining portion of the display side connector may have a recessed shape, and the remaining portion of the bracket side connector corresponding to the remaining portion of the display side connector may have a protruding shape.

The ordinal numbers of “first”, “second”, “third”, “fourth”, “fifth”, “sixth”, “seventh”, “eighth”, “ninth”, “tenth”, “eleventh” and “twelfth” do not limit the configuration of the first connector 100, the second connector 200, the third connector 300, the fourth connector 400, the fifth connector 500, the sixth connector 600, the seventh connector 700, the eighth connector 800, the ninth connector 900, the tenth connector 1000, the eleventh connector 1100 and the twelfth connector 1200.

In the related art, when a display apparatus includes a plurality of display units, a cable may be needed for electrical connection between the plurality of display units. However, a work for connecting cables between the plurality of display units may be complicated. The cable connections between the plurality of display units may impair the aesthetics of the display apparatus.

In comparison with the related art, according to the present disclosure, a separate cable for electrical connection between the plurality of display units 10 may not be needed. The display units adjacent to each other among the plurality of display units 10 may be electrically connected to each other by the connection bracket 20. By simply attaching the connection bracket 20 to the plurality of display units 10, the plurality of display units 10 may be electrically connected to each other. That is, a cable connection work may be omitted, and the electrical connection between the plurality of display units 10 may be easily made. Connectors, electronic circuits, electronic components, cables, etc., for electrical connection between the plurality of display units 10 may be built into the connection bracket 20. For example, the connection bracket 20 may include the connectors 300, 400, 700, 800, 1100 and/or 1200 corresponding to the connectors 100, 200, 500, 600, 900 and/or 1000 formed on the display unit 10. The aesthetics of the display apparatus 1 may be improved.

The plurality of display units 10 may include a coupler 60, and the connection bracket 20 may include a coupler 70 provided to be coupled to the coupler 60. As the coupler 60 of the display unit 10 and the coupler 70 of the connection bracket 20 are coupled, the coupling force between the display units 10 and the connection bracket 20 may be increased. Accordingly, the connection bracket 20 may not be easily separated from the plurality of display units 10. The electrical connection between the plurality of display units 10 and the connection brackets 20 may not be easily broken.

For example, each of the coupler 60 and the coupler 70 may be formed of a magnetic material. For example, an attractive force may act between the coupler 60 and the coupler 70. Alternatively, each of the coupler 60 and the coupler 70 may include an electropermanent magnet, and as a current is supplied between the coupler 60 and the coupler 70, the coupler 60 and the coupler 70 may be separated. Alternatively, each of the coupler 60 and the coupler 70 may include an electromagnet, and as a current between the coupler 60 and the coupler 70 is blocked, the coupler 60 and the coupler 70 may be separated. Alternatively, the coupler 60 and the coupler 70 may be coupled by a separate fastening member (e.g., screw, etc.). Alternatively, the coupler 60 and the coupler 70 may be coupled by having shapes that correspond to each other. For example, one of the coupler 60 and the coupler 70 may include a hook, and the other of the coupler 60 and the coupler 70 may include a hook groove (or hook hole) provided to be locked to the hook. However, the present disclosure is not limited to the above-described examples, and the coupler 60 and the coupler 70 may be coupled through various known methods.

For example, the first display unit **10*a* may include a first coupler 60*a*. The first coupler 60*a* may be disposed around the first connector 100 and/or the fifth connector 500. At least one first coupler 60*a* may be provided. For example, the second display unit 10*b* may include a second coupler 60*b*. The second coupler 60*b* may be disposed around the second connector 200 and/or the sixth connector 600. At least one second coupler 60*b* may be provided. For example, the third display unit 10*c* may include a third coupler 60*c*. The third coupler 60*c* may be disposed around the ninth connector 900 and/or the tenth connector 1000. At least one third coupler 60*c*** may be provided.

For example, the connection bracket 20 may include a fourth coupler **70*a* formed on the first panel 20*a* and coupled to the first coupler 60*a*. For example, the connection bracket 20 may include a fifth coupler 70*b* formed on the second panel 20*b* and coupled to the second coupler 60*b*. For example, the connection bracket 20 may include a sixth coupler 70*c* formed on the third panel 20*c* and coupled to the third coupler 60*c***.

For example, an attractive force may act between the first coupler **60*a* and the fourth coupler 70*a*. For example, an attractive force may act between the second coupler 60*b* and the fifth coupler 70*b*. For example, an attractive force may act between the third coupler 60*c* and the sixth coupler 70*c***.

Figure 9:
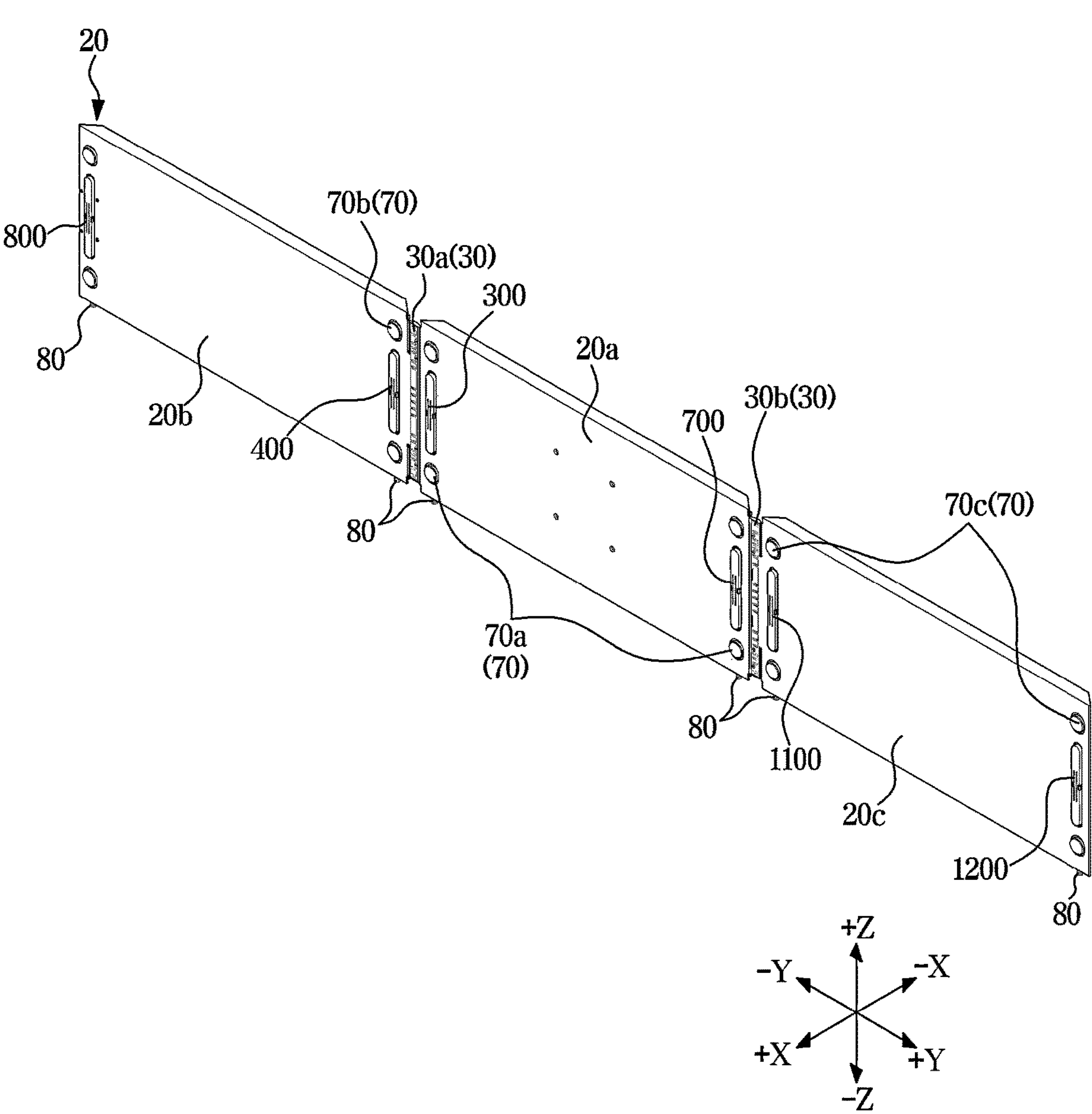
FIG. 9 is a perspective view of the connection bracket according to an embodiment of the disclosure.
Figure 11:
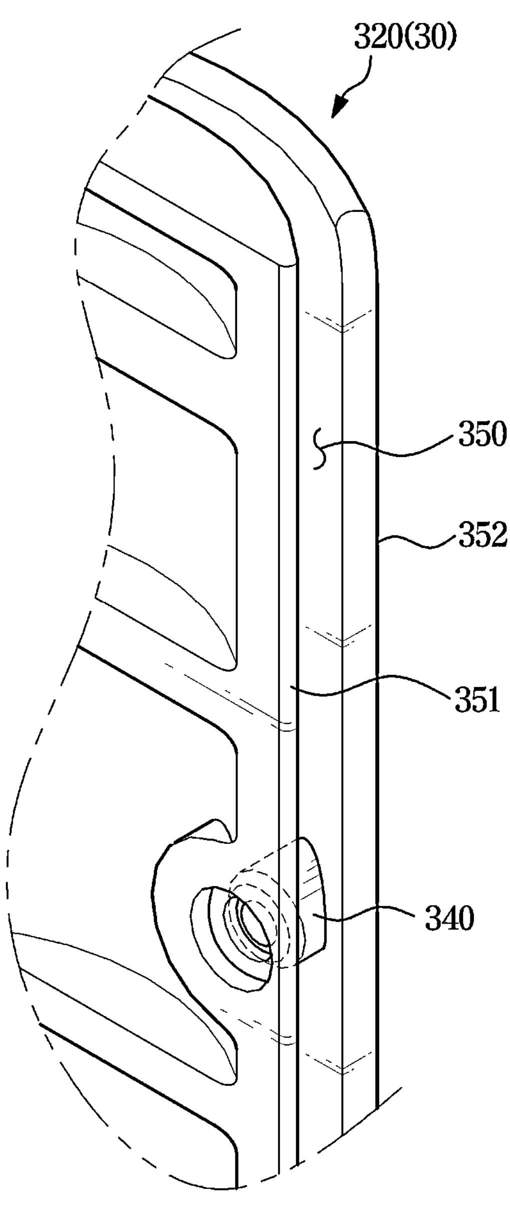
FIG. 11 is an enlarged view of part C shown in FIG. 10.
Figure 12:
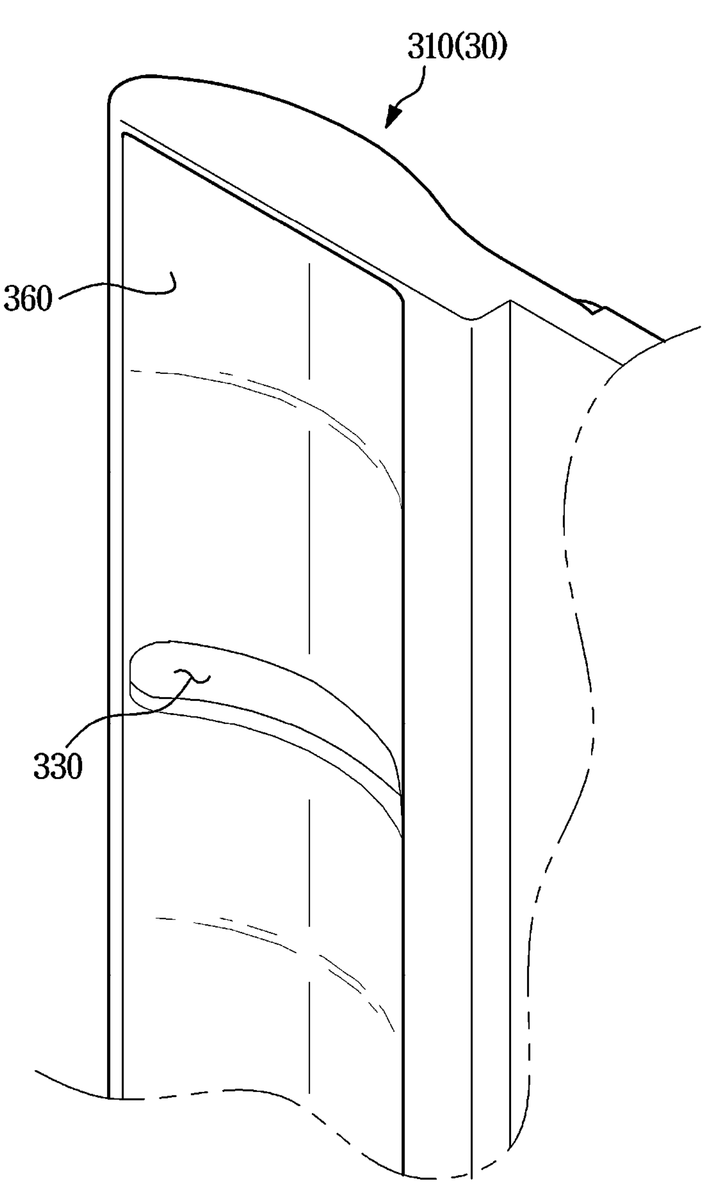
FIG. 12 is an enlarged view of part D shown in FIG. 10.
Figure 13:
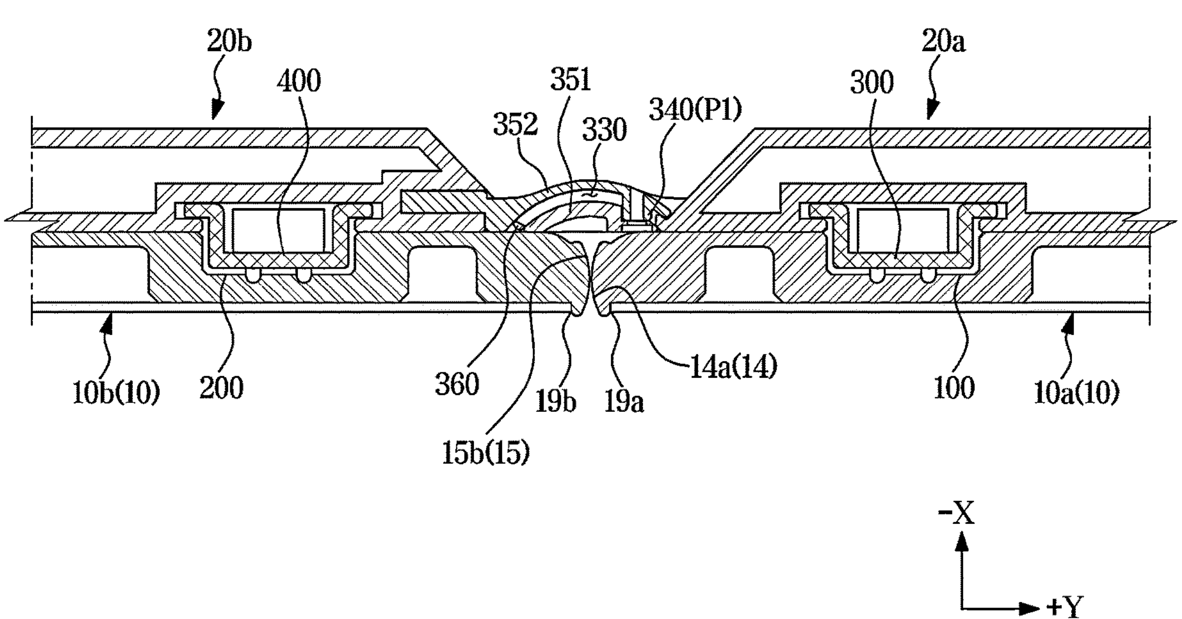
FIG. 13 is a partial plan cross-sectional view of an example of the display apparatus in an unfolded state according to an embodiment of the disclosure.
Figure 14:
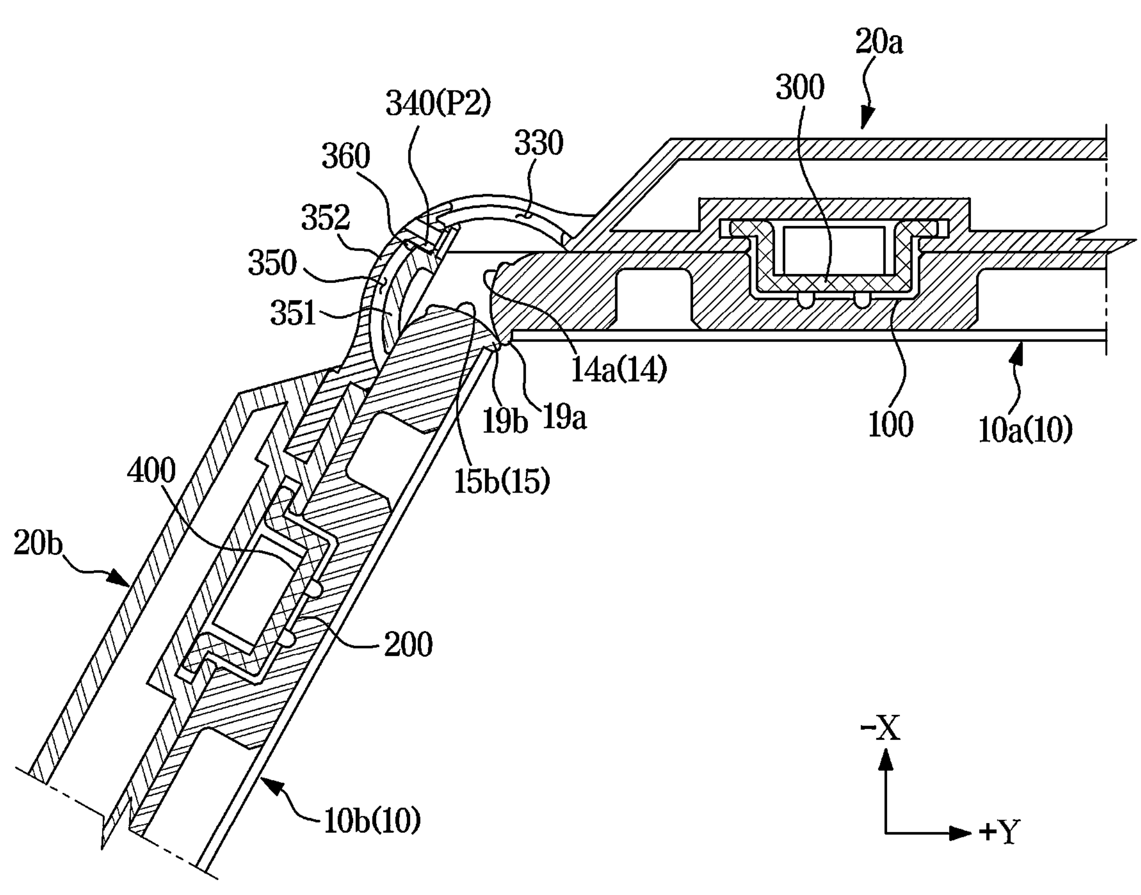
FIG. 14 is a partial plan cross-sectional view of an example of the display apparatus in a folded state according to an embodiment of the disclosure.

FIG. 9 is a perspective view of the connection bracket according to one embodiment. FIG. 10 is an exploded view of a portion of the connection bracket shown in FIG. 9. FIG. 11 is an enlarged view of part C shown in FIG. 10. FIG. 12 is an enlarged view of part D shown in FIG. 10. FIG. 13 is a partial plan cross-sectional view of an example of the display apparatus in an unfolded state. FIG. 14 is a partial plan cross-sectional view of an example of the display apparatus in a folded state.

Referring to FIG. 9, the connection bracket 20 may include the hinge 30. The hinge 30 may be configured to adjust an angle between display units adjacent to each other among the plurality of display units 10. For example, while the connection bracket 20 is mounted on the plurality of display units 10, the hinge 30 of the connection bracket 20 may allow display units, which are adjacent to each other among the plurality of display units 10, to be folded and/or tilted.

The hinge 30 may be disposed between panels adjacent to each other among the panels of the connection bracket 20. In the drawing, it is illustrated that a hinge **30*a* is disposed between the first panel 20*a* and the second panel 20*b* of the connection bracket 20, and a hinge 30*b* is disposed between the first panel 20*a* and the third panel 20*c* of the connection bracket 20, but the present disclosure is not limited thereto. For example, when the display apparatus 1 includes the first display unit 10*a* and the second display unit 10*b*, the connection bracket 20 may include the first panel 20*a* and the second panel 20*b* and a single hinge 30*a* may be disposed between the first panel 20*a* and the second panel 20*b*. For example, the number of hinges 30 may be one less than the number of panels of the connection brackets 20**.

The hinge 30 may be configured to be slidable. The hinge 30 may be configured to be rotatable within a predetermined range. For example, the hinge 30 may have a shape that is convexly curved backward. For example, the hinge 30 may be configured to be flexible.

An example of the hinge 30 of the connection bracket 20 will be described with reference to FIGS. 10 to 14. Particularly, the hinge **30*a* disposed between the first panel 20*a* and the second panel 20_b_ of the connection bracket 20 will be described with reference to FIGS. 10 to 14. A description of the hinge 30_a_ described below may be equally applied to the hinge 30_b_ disposed between the first panel 20_a_ and the third panel 20_c_. Additionally, the description of the hinge 30**_a_ described below may also be applied to at least one hinge that is added to the connection bracket as at least one display unit is added. For example, when the display apparatus further includes a fourth display unit (not shown) disposed adjacent to the second display unit (or third display unit), the content of the present disclosure may also be applied to a hinge (not shown) for adjusting an angle between the second display unit (or third display unit) and the fourth display unit.

The hinge 30_a_ may be configured to adjust an angle between the first display unit 10_a_ on which the first panel 20_a_ is mounted and the second display unit 10_b_ on which the second panel 20_b_ is mounted. For example, the hinge 30_a_ may rotate the first display unit 10_a_ with respect to the second display unit 10_b_ within a predetermined range. For example, the hinge 30_a_ may rotate the second display unit 10_b_ with respect to the first display unit 10_a_ within a predetermined range.

The hinge 30_a_ may be configured to be slidable between the first panel 20_a_ and the second panel 20_b_. As the hinge 30_a_ slides, a length of the hinge 30_a_ may be variable. The length of the hinge 30_a_ may increase or decrease within a predetermined range.

The hinge 30_a_ may include a first hinge portion 310 extending from the first panel 20_a_. The hinge 30_a_ may include a second hinge portion 320 extending from the second panel 20_b_. The second hinge portion 320 may be detachably coupled to the first hinge portion 310. The second hinge portion 320 may be slidably coupled to the first hinge portion 310. That is, the first hinge portion 310 and the second hinge portion 320 may slide relative to each other.

The hinge 30_a_ may include a hinge rail 330 and a hinge protrusion 340. The hinge rail 330 may be formed on one of the first hinge portion 310 and the second hinge portion 320. The hinge protrusion 340 may be formed on the other of the first hinge portion 310 and the second hinge portion 320. In the drawing, it is illustrated that the hinge rail 330 is formed on the first hinge portion 310 and the hinge protrusion 340 is formed on the second hinge portion 320, but the present disclosure is not limited thereto. Unlike the drawings, the hinge rail 330 may be formed on the second hinge portion 320 and the hinge protrusion 340 may be formed on the first hinge portion 310.

The hinge protrusion 340 may be configured to perform a relative movement along the hinge rail 330. For example, while the hinge rail 330 is maintained in a fixed position, the hinge protrusion 340 may slide relative to the hinge rail 330. For example, while the hinge protrusion 340 is maintained in a fixed position, the hinge rail 330 may slide relative to the hinge protrusion 340. For example, the hinge protrusion 340 and the hinge rail 330 may slide relative to each other. For example, the hinge protrusion 340 may be configured to be movable between a first position P1 (refer to FIG. 13) provided at one end of the hinge rail 330, and a second position P2 (refer to FIG. 14) provided at the other end of the hinge rail 330. Accordingly, the length of the hinge 30_a_ may be variable.

For example, the hinge rail 330 may have an arc shape. The hinge rail 330 and the hinge protrusion 340 may be configured to slide relative to each other along an arc shape. Accordingly, the hinge 30_a_ may be configured to be rotatable within a predetermined range.

For example, the hinge rail 330 may be formed to penetrate a hinge protruding portion 360, which will be described later. For example, the hinge protrusion 340 may have a shape extending between a first hinge body 351 and a second hinge body 352, which will be described later. However, this is only an example, and the hinge rail 330 may be formed separately from the hinge protruding portion 360, and the hinge protrusion 340 may be formed separately from the first hinge body 351 and the second hinge body 352.

For example, a plurality of hinge rails 330 may be provided, and the plurality of hinge rails 330 may be arranged along the vertical direction (Z direction). For example, the hinge protrusion 340 may be provided in plurality to correspond to the hinge rail 330. Each of the plurality of hinge protrusions 340 may be provided to correspond to each of the plurality of hinge rails 330.

The hinge 30_a_ may include a hinge groove 350 and the hinge protruding portion 360. The hinge groove 350 may be formed on one of the first hinge portion 310 and the second hinge portion 320. The hinge protruding portion 360 may be formed on the other of the first hinge portion 310 and the second hinge portion 320. In the drawing, it is illustrated that the hinge groove 350 is formed in the second hinge portion 320 and the hinge protruding portion 360 is formed in the first hinge portion 310, but the present disclosure is not limited thereto. Unlike the drawings, the hinge groove 350 may be formed in the first hinge portion 310 and the hinge protruding portion 360 may be formed in the second hinge portion 320.

The hinge protruding portion 360 may be withdrawn from the hinge groove 350 and inserted into the hinge groove 350. For example, as the first hinge portion 310 and the second hinge portion 320 slide relative to each other, the hinge protruding portion 360 may be withdrawn from the hinge groove 350 and exposed to the outside of the hinge 30_a_, or the hinge protruding portion 360 may be inserted into the hinge groove 350 and not exposed to the outside of the hinge 30_a_. Accordingly, the length of the hinge 30_a_ may be variable.

For example, the second hinge portion 320 may include a first hinge body 351 and a second hinge body 352 spaced apart from the first hinge body 351. The hinge groove 350 may be formed between the first hinge body 351 and the second hinge body 352. The hinge protruding portion 360 may enter between the first hinge body 351 and the second hinge body 352 and be inserted into the hinge groove 350. However, when the hinge groove 350 is formed in the first hinge portion 310, the first hinge portion 310 may include the first hinge body 351 and the second hinge body 352.

For example, the first hinge body 351 and the second hinge body 352 may each have a shape curved backward, and the hinge groove 350 may also have a shape curved backward. The hinge protruding portion 360 may have a shape that is inserted into the hinge groove 350. The hinge protruding portion 360 and the hinge groove 350 may be provided to slide relative to each other along a curved shape. Accordingly, the hinge 30_a_ may be configured to be rotatable within a predetermined range.

Referring to FIGS. 13 and 14, as the hinge 30 of the connection bracket 20 slides, the display apparatus 1 may be converted from an unfolded state (refer to FIG. 13) to a folded state (refer to FIG. 14). Conversely, as the hinge 30 of the connection bracket 20 slides, the display apparatus 1 may be converted from the folded state (refer to FIG. 14) to the unfolded state (refer FIG. 13).

Referring to FIG. 13, the display apparatus 1 may be provided in the unfolded state. At this time, the first display unit 10*a* and the second display unit 10*b* may be arranged side by side in the lateral direction (Y direction). An angle formed by the first display unit 10*a* and the second display unit 10*b* may be approximately 180 degrees. The screen of the first display unit 10*a* and the screen of the second display unit 10*b* may be provided on the same plane. A front edge 19*a* of the first side 14*a* of the first display unit 10*a* may not be in contact with a front edge 19*b* of the second side 15*b* of the second display unit 10*b*.

When the display apparatus 1 is in the unfolded state, the hinge protruding portion 360 may be inserted into the hinge groove 350. The hinge protruding portion 360 may not be exposed to the outside of the hinge 30*a*. The hinge protruding portion 360 may be covered by the first hinge body 351 and the second hinge body 352.

When the display apparatus 1 is in the unfolded state, the hinge protrusion 340 may be in the first position P1 provided at one end of the hinge rail 330. While the hinge protrusion 340 is in the first position P1, the front surface of the first display unit 10*a* and the front surface of the second display unit 10*b* may be provided on the same plane.

When the display apparatus 1 is in the unfolded state, the length of the hinge 30*a* may be the minimum length of the hinge 30*a*. An overlapping area between the first hinge portion 310 and the second hinge portion 320 of the hinge 30*a* may be maximum.

Referring to FIG. 14, the display apparatus 1 may be provided in the folded state. At this time, the second display unit 10*b* may be in a state after sliding relative to the first display unit 10*a*. However, unlike the drawing, the first display unit 10*a* may be in a state after sliding relative to the second display unit 10*b*. Alternatively, the first display unit 10*a* and the second display unit 10*b* may be in a state after sliding relative to each other. The first display unit 10*a* and the second display unit 10*b* may be in a state after rotating relative to each other. An angle formed by the first display unit 10*a* and the second display unit 10*b* may be less than 180 degrees. The screen of the first display unit 10*a* and the screen of the second display unit 10*b* may be provided on different planes. The front edge 19*a* of the first side 14*a* of the first display unit 10*a* may be in contact with the front edge 19*b* of the second side 15*b* of the second display unit 10*b*. For example, a point where the front edge 19*a* of the first display unit 10*a* and the front edge 19*b* of the second display unit 10*b* come into contact may be provided to form a rotation center of the hinge 30*a*. For example, the first hinge portion 310 and the second hinge portion 320 may be rotatable with respect to the point where the front edge 19*a* of the first display unit 10*a* and the front edge 19*b* of the second display unit 10*b* come into contact.

When the display apparatus 1 is the folded state, the hinge protruding portion 360 may be withdrawn from the hinge groove 350. At least a portion of the hinge protruding portion 360 may be exposed to the outside of the hinge 30*a*.

When the display apparatus 1 is the folded state, the hinge protrusion 340 may be in the second position P2 provided at the other end of the hinge rail 330. While the hinge protrusion 340 is in the second position P2, the angle formed by the first display unit 10*a* and the second display unit 10*b* may be less than 180 degrees.

When the display apparatus 1 is the folded state, the length of the hinge 30*a* may be the maximum length of the hinge 30*a*. The overlapping area between the first hinge portion 310 and the second hinge portion 320 of the hinge 30*a* may be minimal.

Meanwhile, referring to FIG. 10, a first gap 221 may be formed between the first panel 20*a* and the third connector 300. As will be described later, while the position of the third connector 300 is adjusted (refer to FIGS. 19 and 20), the third connector 300 may be movable within the first gap 221 and may not interfere with other components. Accordingly, the third connector 300 may be maintained in a state of being connected to the first connector 100, and the electrical connection between the third connector 300 and the first connector 100 may not be easily broken. For example, the third connector 300 may move along the connector rail 22*a* or 22 formed on the first panel 20*a,* and the first gap 221 may be formed between the third connector 300 and the connector rail 22*a* or 22. In summary, while a position adjusting device 80 (refer to FIGS. 19 and 20) moves the third connector 300 coupled to the first connector 100, the first gap 221 may be formed between the first panel 20*a* and the third connector 300 to maintain the state in which the third connector 300 is coupled to the first connector 100.

A second gap 222 may be formed between the second panel 20*b* and the fourth connector 400. As will be described later, while the position of the fourth connector 400 is adjusted (refer to FIGS. 19 and 20), the fourth connector 400 may be movable within the second gap 222 and may not interfere with other components. Accordingly, the fourth connector 400 may be maintained in a state of being connected to the second connector 200, and the electrical connection between the fourth connector 400 and the second connector 200 may not be easily broken. For example, the fourth connector 400 may move along the connector rail 22*b* or 22 formed on the second panel 20*b,* and the second gap 222 may be formed between the fourth connector 400 and the connector rail 22*b* or 22. In summary, while the position adjusting device 80 (refer to FIGS. 19 and 20) moves the fourth connector 400 coupled to the second connector 200, the second gap 222 may be formed between the second panel 20*b* and the fourth connector 400 to maintain the state in which the fourth connector 400 is coupled to the second connector 200.

The description about the gap of the third connector 300 and the fourth connector 400 may be also applied to the seventh connector 700, the eighth connector 800, the eleventh connector 1100, and the twelfth connector 1200.

Figure 15:
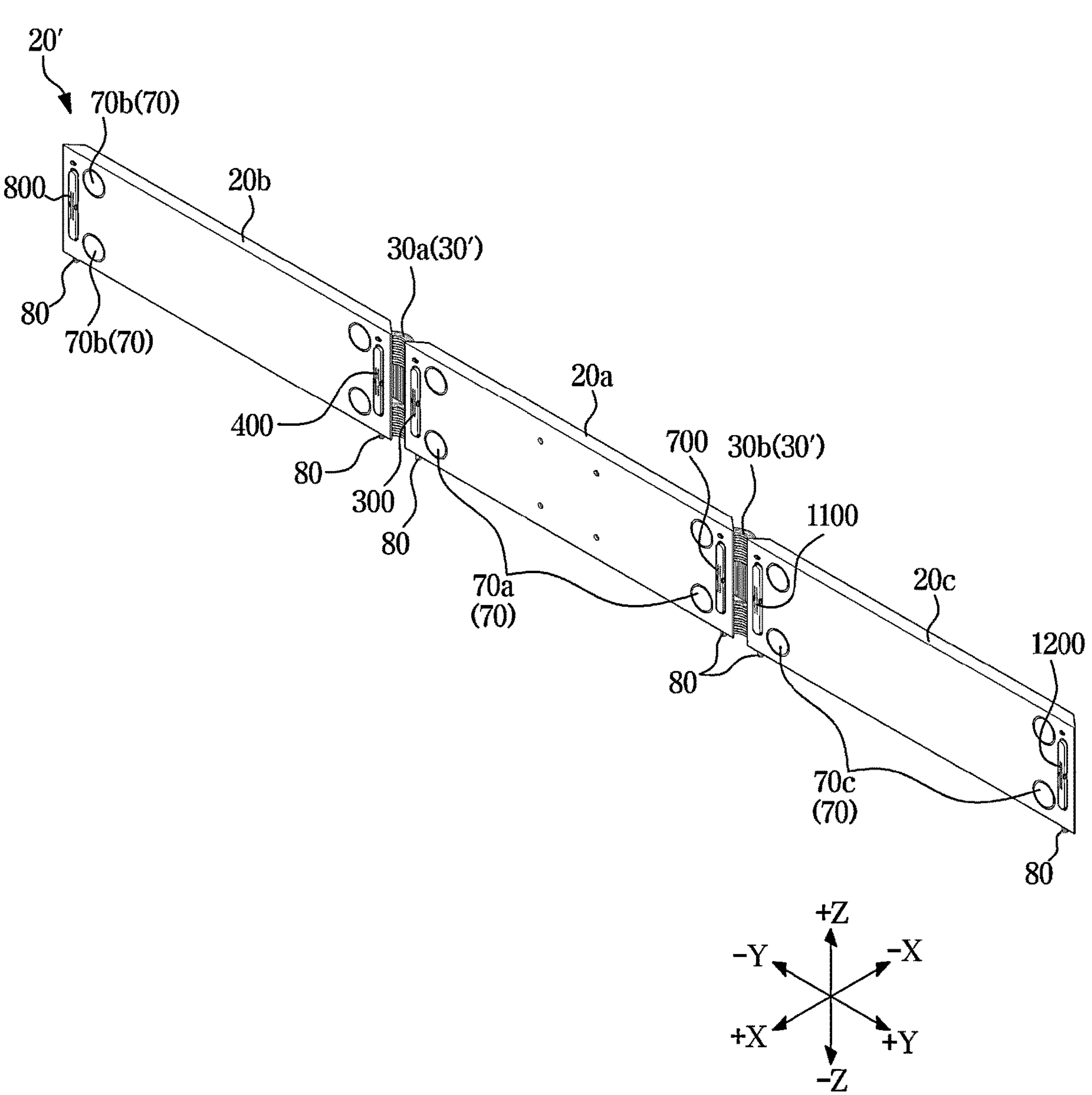
FIG. 15 is a perspective view of a display apparatus according to an embodiment of the disclosure.
Figure 16:
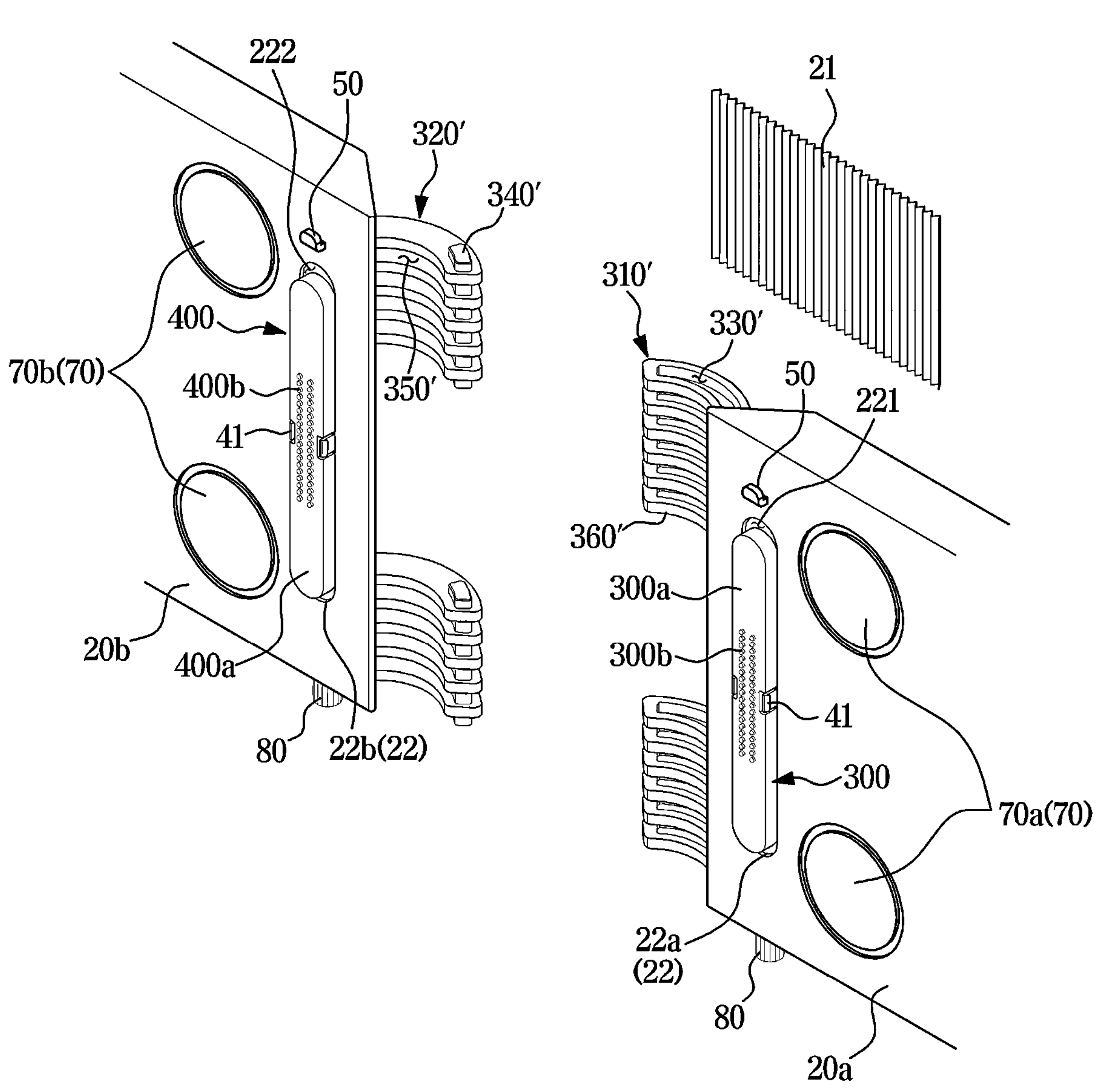
FIG. 16 is an exploded view of a portion of a connection bracket shown in FIG. 15.
Figure 17:
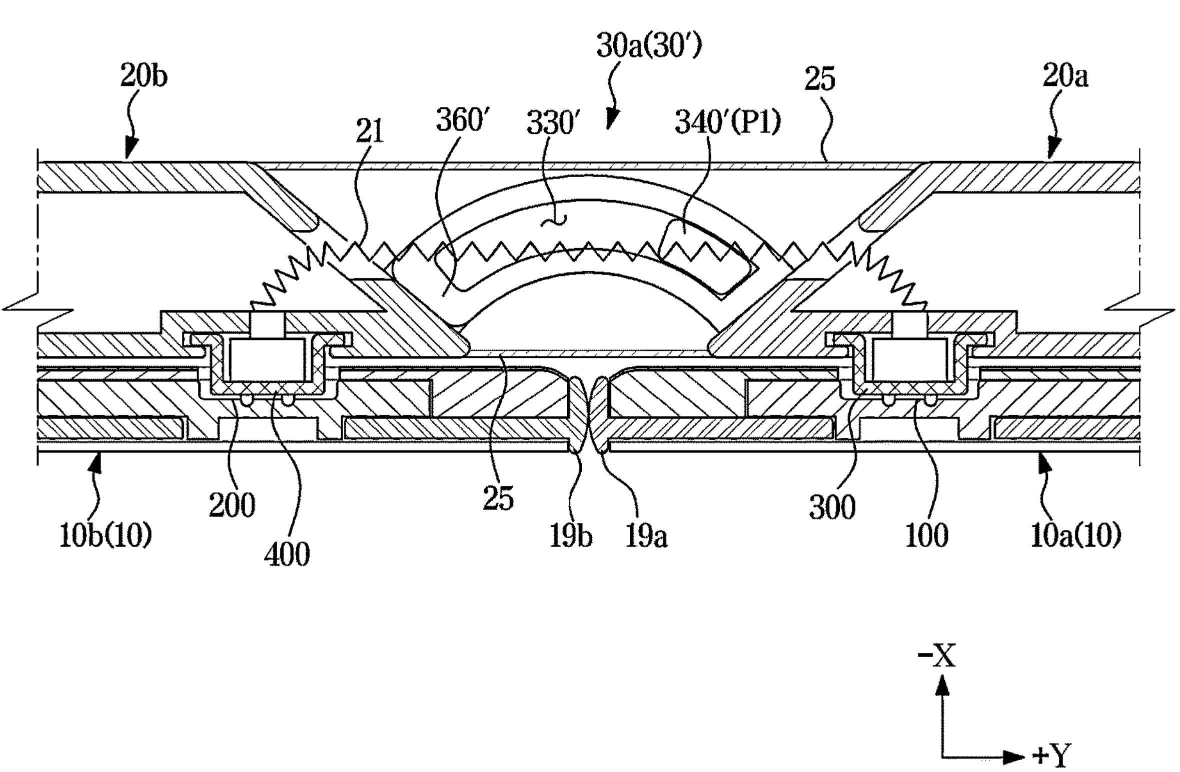
FIG. 17 is a partial plan cross-sectional view of an example of the display apparatus in an unfolded state according to an embodiment of the disclosure.
Figure 18:
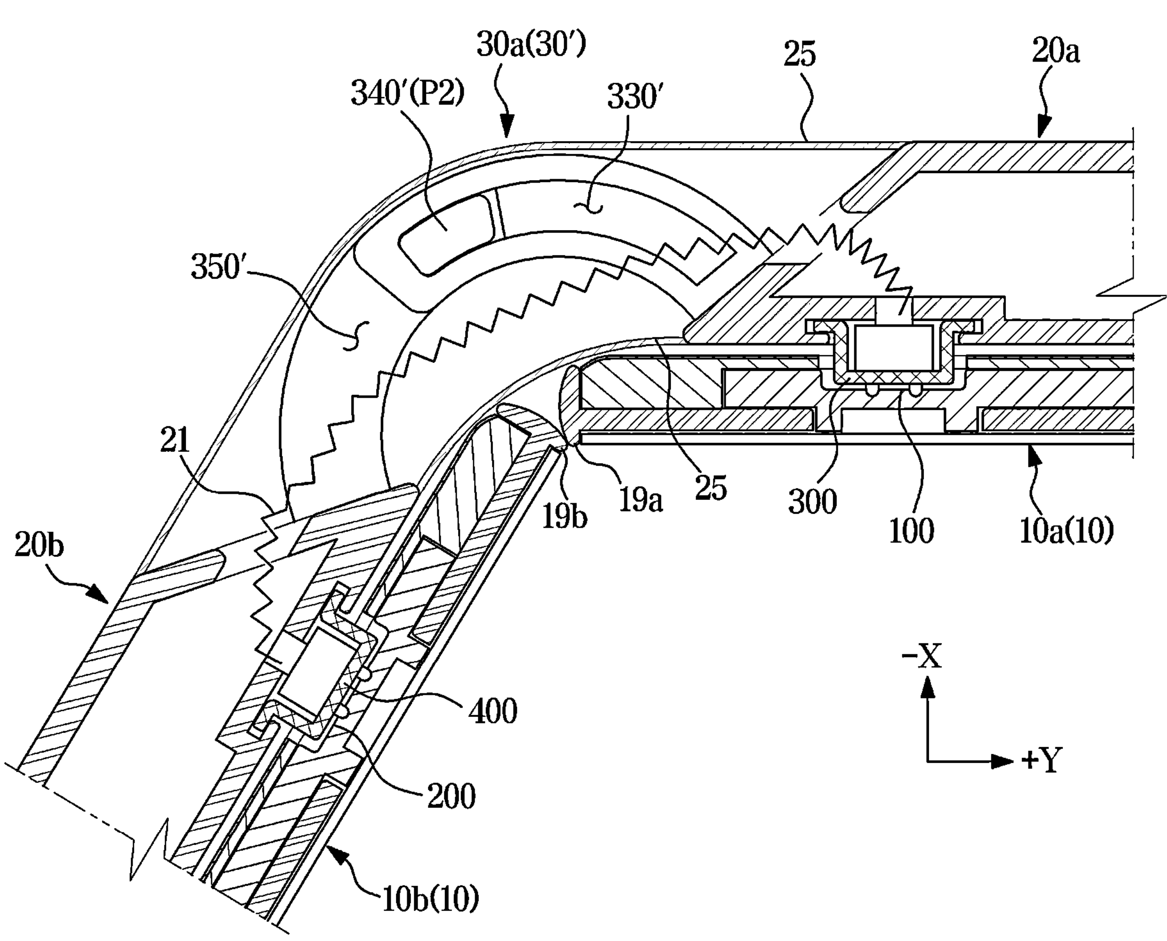
FIG. 18 is a partial plan cross-sectional view of an example of the display apparatus in a folded state according to an embodiment of the disclosure.

FIG. 15 is a perspective view of a display apparatus according to one embodiment. FIG. 16 is an exploded view of a portion of a connection bracket shown in FIG. 15. FIG. 17 is a partial plan cross-sectional view of an example of the display apparatus in an unfolded state. FIG. 18 is a partial plan cross-sectional view of an example of the display apparatus in a folded state.

An example of a connection bracket 20' will be described with reference to FIGS. 15 to 18. In describing the connection bracket 20' shown in FIGS. 15 to 18, the same member numbers may be assigned to the same components as those of the connection bracket 20 shown in FIGS. 1 to 14. A shape of a hinge 30' of the connection bracket 20' shown in FIGS. 15 to 18 may be slightly different from the shape of the hinge 30 of the connection bracket 20 shown in FIGS. 1 to 14. However, other than this, the connection bracket 20' shown in FIGS. 15 to 18 may include substantially the same configuration as the connection bracket 20 shown in FIGS. 1 to 14. Additionally, the hinge 30' shown in FIGS. 15 to 18 may operate substantially the same as the hinge 30 shown in FIGS. 1 to 14. Therefore, a description the same as the above-mentioned description may be omitted.

The hinge 30' may include a first hinge portion 310' extending from the first panel 20*a*. The hinge 30' may include a second hinge portion 320' extending from the second panel 20*b*. A plurality of first hinge portions 310' may be provided, and the plurality of first hinge portions 310' may be arranged along the vertical direction (Z direction). A plurality of second hinge portions 320' may be provided, and the plurality of second hinge portions 320' may be arranged along the vertical direction (Z direction).

The hinge 30' may include a hinge rail 330' and a hinge protrusion 340'. The hinge rail 330' and the hinge protrusion 340' may be slidably coupled to each other. The hinge protrusion 340' may be configured to perform a relative movement along the hinge rail 330'.

The hinge rail 330' may be formed in one of the first hinge portion 310' and the second hinge portion 320'. The hinge protrusion 340' may be formed on the other of the first hinge portion 310' and the second hinge portion 320'. In the drawing, it is illustrated that the hinge rail 330' is formed on each of the plurality of first hinge portions 310', and the hinge protrusion 340' is formed on each of the plurality of second hinge portions 320', but the present disclosure is not limited thereto. For example, the hinge rail 330' may be formed on each of the plurality of second hinge portions 320', and the hinge protrusion 340' may be formed on each of the plurality of first hinge portions 310'. For example, some of the plurality of hinge rails 330' may be formed on some of the plurality of second hinge portions 320', and others of the plurality of hinge rails 330' may be formed on some of the plurality of first hinge portions 310'. The plurality of hinge protrusions 340' may be formed to correspond to the plurality of hinge rails 330'.

The hinge 30' may include a hinge groove 350' and a hinge protruding portion 360'. The hinge groove 350' and the hinge protruding portion 360' may be slidably coupled to each other. The hinge protruding portion 360' may be configured to be withdrawn from the hinge groove 350' and inserted into the hinge groove 350'.

The hinge groove 350' may be formed in one of the first hinge portion 310' and the second hinge portion 320'. The hinge protruding portion 360' may be formed on the other of the first hinge portion 310' and the second hinge portion 320'. In the drawing, it is illustrated that the hinge groove 350' is formed between second hinge portions adjacent to each other among the plurality of second hinge portions 320', and the hinge protruding portion 360' is formed in the plurality of first hinge portions 310', respectively. However, the present disclosure is not limited thereto. For example, the hinge groove 350' may be formed between first hinge portions adjacent to each other among the plurality of first hinge portions 310', and the hinge protruding portion 360' may be formed in the plurality of second hinge portions 320', respectively. For example, some of the plurality of hinge protruding portions 360' may be formed on some of the plurality of first hinge portions 310', and others of the plurality of hinge protruding portions 360' may be formed on some of the plurality of second hinge portions 320'. The plurality of hinge grooves 350' may be formed to correspond to the plurality of hinge protruding portions 360'.

Referring to FIG. 17, the display apparatus 1 may be provided in the unfolded state. While the hinge protrusion 340' is in the first position P1, the front surface of the first display unit 10*a* and the front surface of the second display unit 10*b* may be provided on the same plane.

Referring to FIG. 18, the display apparatus 1 may be provided in the folded state. While the hinge protrusion 340' is in the second position P2, the angle formed by the first display unit 10*a* and the second display unit 10*b* may be less than 180 degrees.

The connection bracket 20' may include a cover member 25 provided to cover the cable 21. The cover member 25 may be arranged between the first panel 20*a* and the second panel 20*b* to protect the cable 21. For example, the cover member 25 may be provided to connect the rear of the first panel 20*a* and the rear of the second panel 20*b*. For example, the cover member 25 may be provided to connect the front of the first panel 20*a* and the front of the second panel 20*b*. For example, the cover member 25 may be provided to be flexible. For example, the cover member 25 may be affected by the operation of the hinge 30'. For example, as the hinge 30' slides, a length of the cover member 25 may increase and decrease within a predetermined range. Meanwhile, although not shown in the drawings, the above-described connection bracket 20 may also include a cover member 25.

The connection bracket 20' may include a guide portion 50 provided to guide the coupling of the connection bracket 20' and the display unit 10. The display unit 10 may have a shape corresponding to the guide portion 50. For example, the guide portion 50 may have a shape that protrudes from each of the panels 20*a*, 20*b*, and 20*c* of the connection bracket 20', and the display unit 10 may have a recessed or pierced shape to allow the guide portion 50 to be locked thereto. The connection bracket 20' may be more easily mounted on the display unit 10 as the connection bracket 20' is provided with the guide portion 50. The connection bracket 20' may be mounted at an accurate position on the display unit 10 as the connection bracket 20' is provided with the guide portion 50. Meanwhile, although not shown in the drawings, the above-described connection bracket 20 may also include a guide portion 50.

Figure 19:
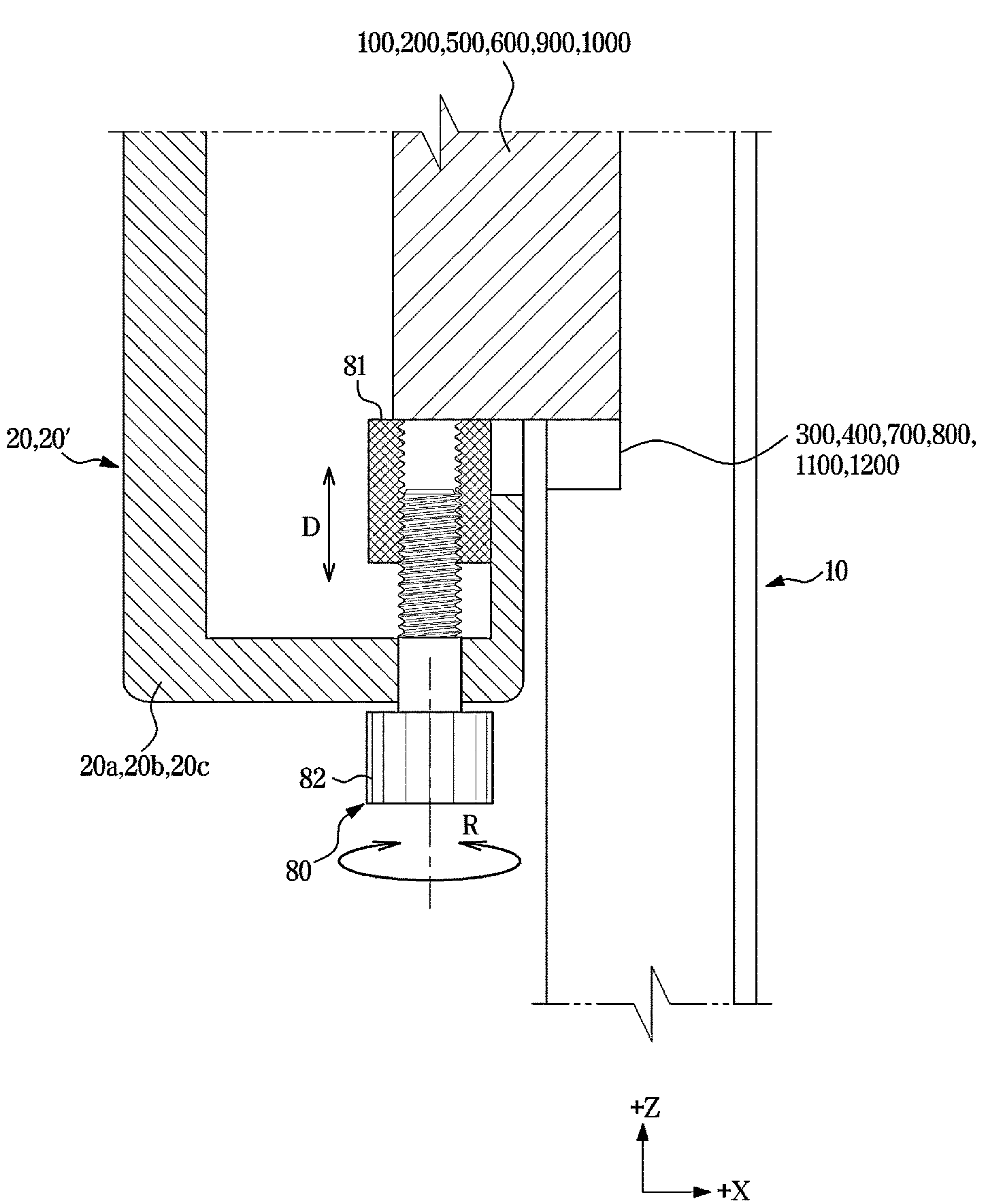
FIG. 19 schematically illustrates a side cross-section of a portion of the display apparatus according to an embodiment of the disclosure.
Figure 20:
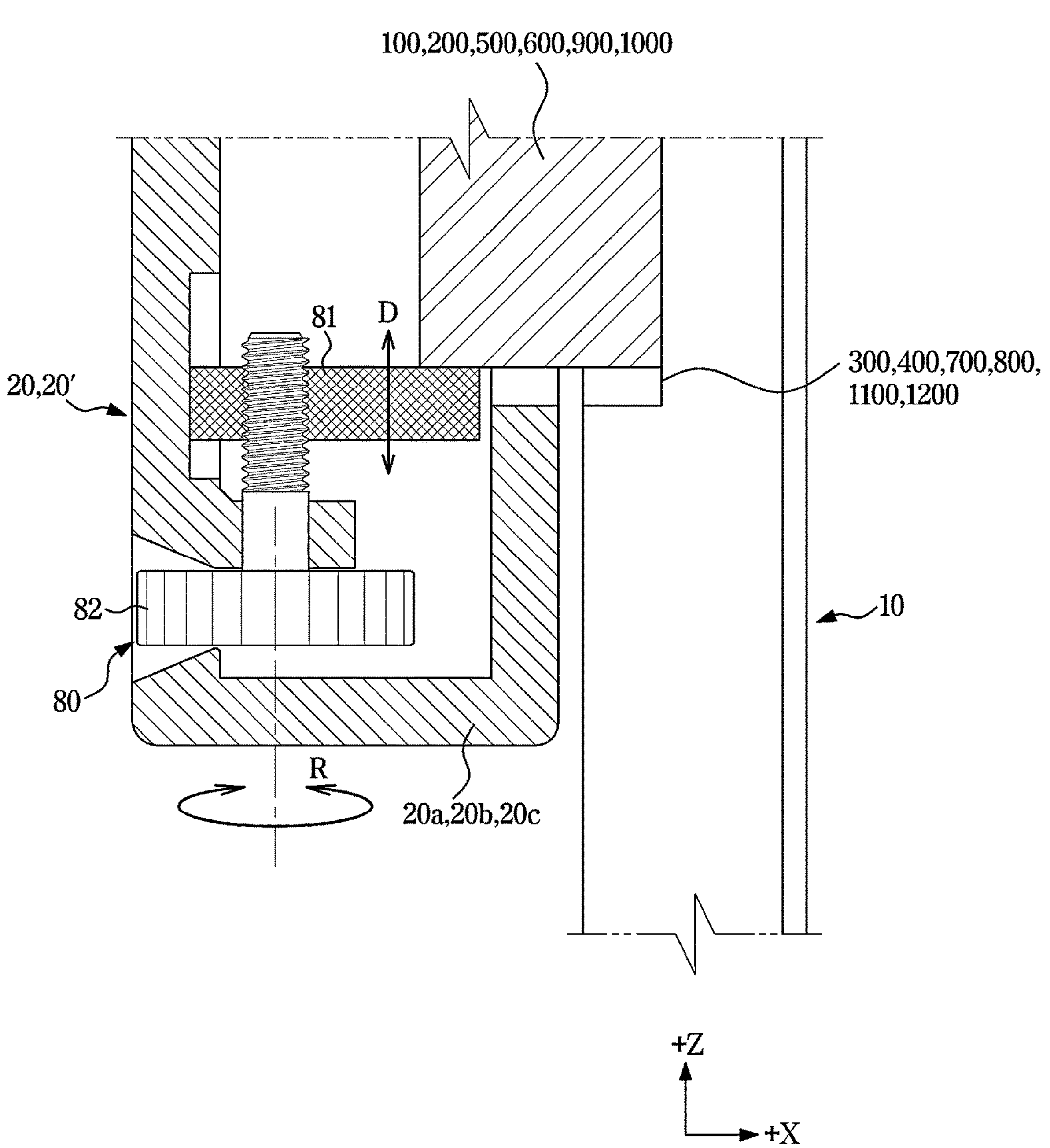
FIG. 20 schematically illustrates a side cross-section of a portion of the display apparatus according to an embodiment of the disclosure.

FIG. 19 schematically illustrates a side cross-section of a portion of the display apparatus according to one embodiment. FIG. 20 schematically illustrates a side cross-section of a portion of the display apparatus according to one embodiment.

The connection brackets 20 and 20' may include a position adjusting device 80. The position adjusting device 80 may be configured to adjust a step difference between the plurality of display units 10. The position adjusting device 80 may be configured to adjust a height of each of the plurality of display units 10. The position adjusting device 80 may be provided in each of the plurality of display units 10 so as to move the plurality of display units 10 in the up and down direction (vertical direction).

The position adjusting device 80 may be provided to correspond to at least one of the bracket side connectors 300, 400, 700, 800, 1100, and/or 1200. In the drawings, it is illustrated that each of the plurality of position adjusting devices 80 corresponds to each of the bracket side connectors 300, 400, 700, 800, 1100 and/or 1200 (refer to FIGS. 9 and 15), but the present disclosure is not limited thereto. For example, the position adjusting device 80 may be provided to correspond to one of the bracket side connectors 300, 400, 700, 800, 1100 and/or 1200, or correspond to some of the bracket side connectors 300, 400, 700, 800, 1100 and/or 1200.

The position adjusting device 80 may move the bracket side connector. The position adjusting device 80 may slide the bracket side connector. For example, when the position adjusting device 80 is provided to correspond to the third connector 300, the position adjusting device 80 may move the third connector 300 connected to the first connector 100 in the substantially vertical direction. For example, when the position adjusting device 80 is provided to correspond to the fourth connector 400, the position adjusting device 80 may move the fourth connector 400 connected to the second connector 200 in the substantially vertical direction. For example, when the position adjusting device 80 is provided to correspond to each of the third connector 300 and the fourth connector 400, the position adjusting device 80 may move at least one of the third connector 300 connected to the first connector 100 or the fourth connector 400 connected to the second connector 200 in the substantially vertical direction.

An example of the position adjusting device 80 will be described with reference to FIGS. 19 and 20. The position adjusting device 80 may include a moving block 81 fixed to the bracket side connectors 300, 400, 700, 800, 1100 and/or 1200, and an adjustment screw 82 rotatably coupled to the moving block 81.

The moving block 81 may be movable in the substantially vertical direction (Z direction), and the bracket side connectors 300, 400, 700, 800, 1100 and/or 1200 may be movable together with the moving block 81. As the bracket side connectors 300, 400, 700, 800, 1100 and/or 1200 move, the display side connectors 100, 200, 500, 600, 900 and/or 1000 connected to the bracket side connectors 300, 400, 700, 800, 1100 and/or 1200 may also be moved. Accordingly, the height of the display unit 10 may be adjusted.

Meanwhile, in the drawing, it is illustrated that the moving block 81 is directly fixed to the bracket side connectors 300, 400, 700, 800, 1100 and/or 1200, but the present disclosure is not limited thereto. However, the moving block 81 may be indirectly fixed to the bracket side connectors 300, 400, 700, 800, 1100 and/or 1200 through a separate intermediate member.

The adjustment screw 82 may be configured to adjust a position of the moving block 81. As the adjustment screw 82 rotates in a state of being coupled to the moving block 81, a rotational movement R of the adjustment screw 82 may be converted into a linear movement D of the moving block 81. As the adjustment screw 82 rotates in a state of being coupled to the moving block 81, the moving block 81 may be moved in the vertical direction. For example, the adjustment screw 82 may be screwed to the moving block 81. For example, a direction of a rotation axis of the adjustment screw 82 may be parallel to a moving direction of the moving block 81.

At least a portion of the adjustment screw 82 may be exposed to the outside of the connection brackets 20 and 20'. Accordingly, a user can rotate the adjustment screw 82 relative to the moving block 81. For example, the adjustment screw 82 may be arranged to protrude downwardly from the connection bracket 20 and 20' (refer to FIGS. 9, 15 and 19) or to protrude toward the rear of the connection brackets 20 and 20' (refer to FIG. 20). However, this is only an example, and the position of the adjustment screw 82 may be not limited as long as the adjustment screw 82 is configured to be rotated with respect to the moving block 81.

Figure 21:
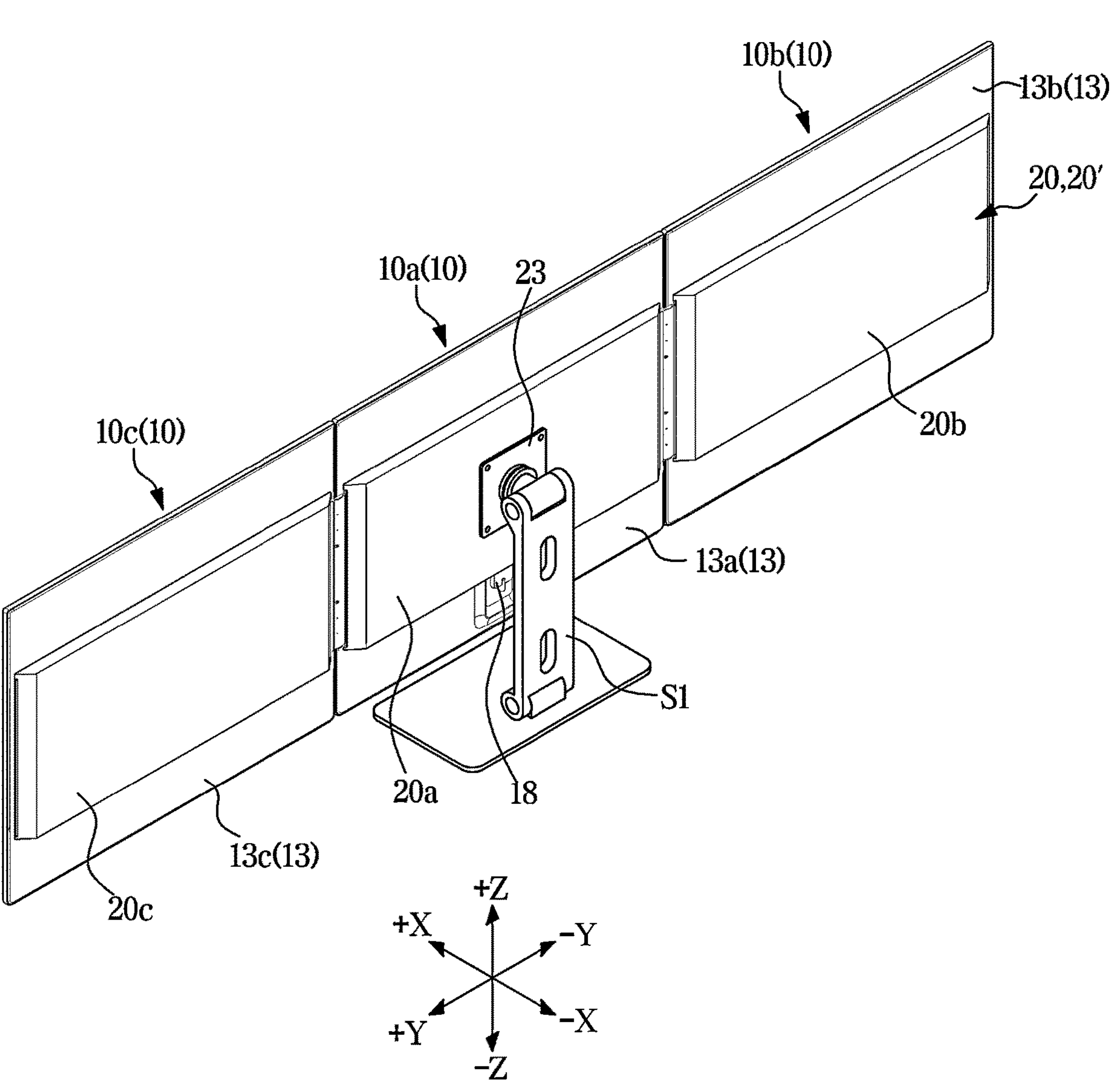
FIG. 21 illustrates an example of the installation of the display apparatus according to an embodiment of the disclosure.
Figure 22:
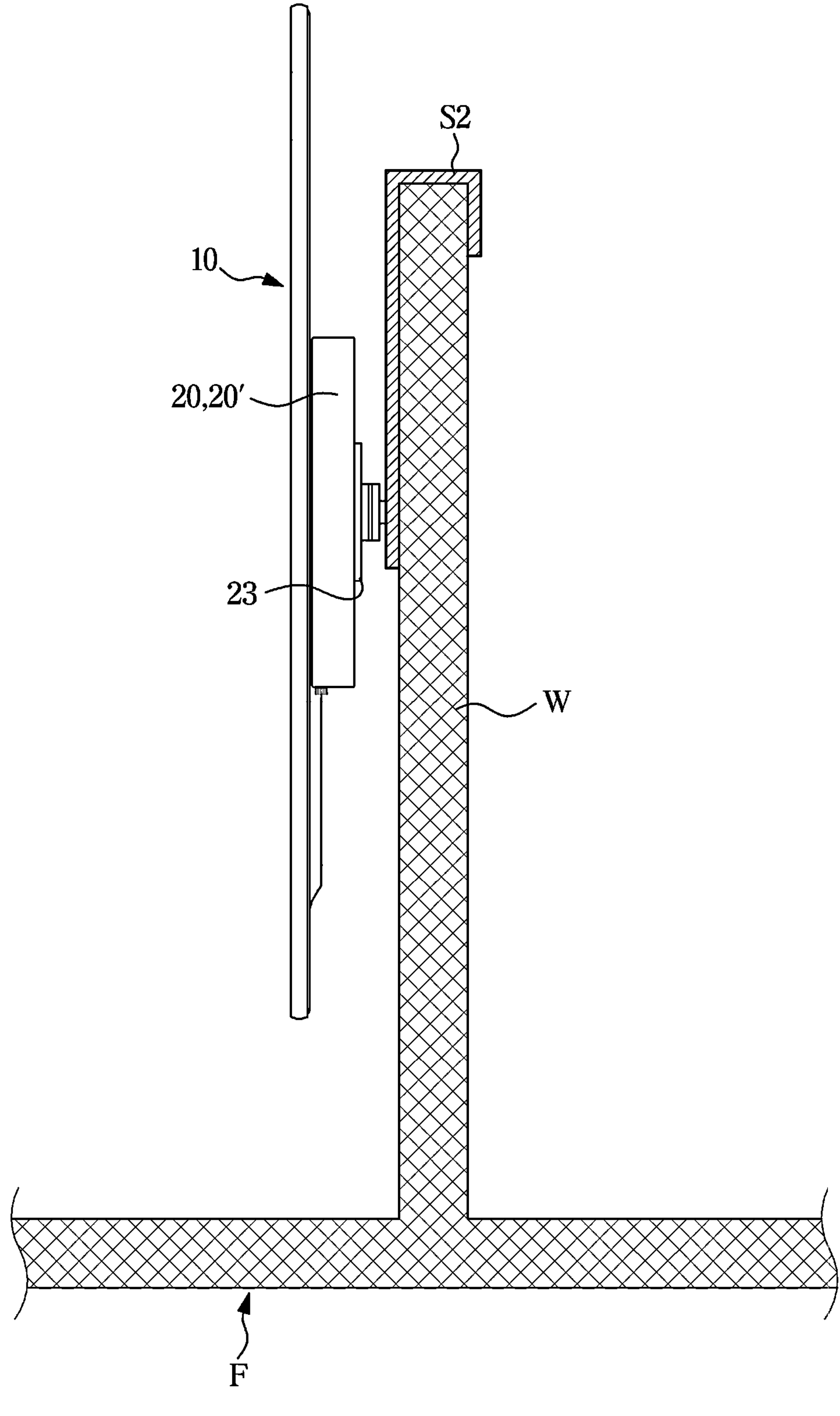
FIG. 22 illustrates an example of the installation of the display apparatus according to an embodiment of the disclosure.
Figure 23:
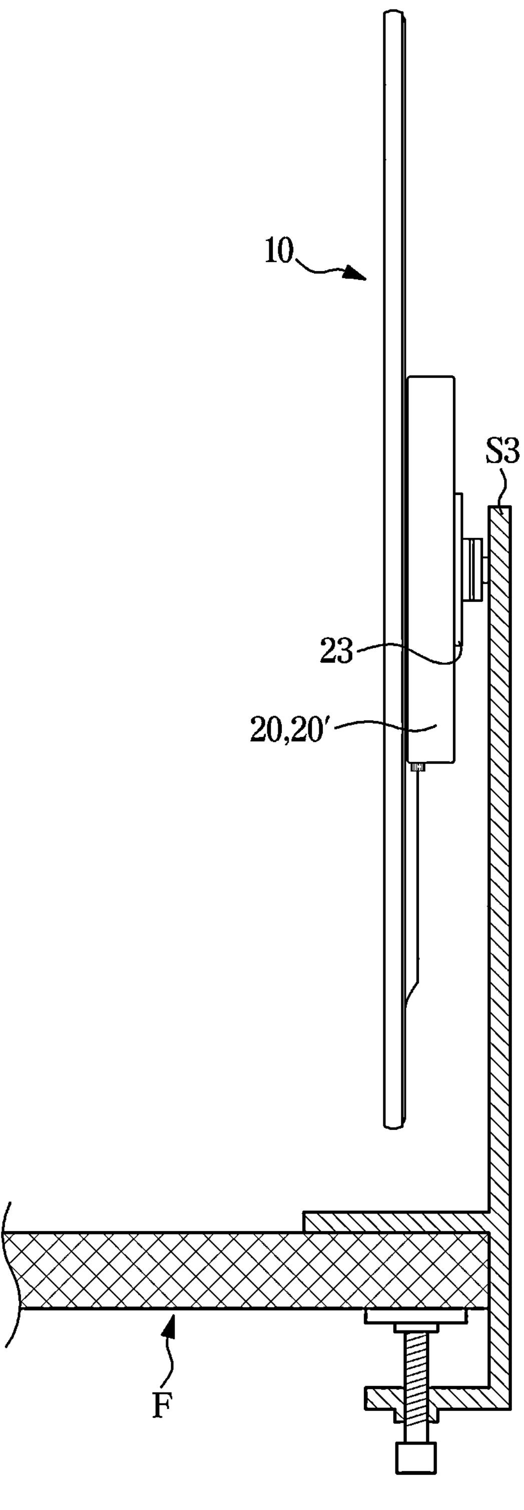
FIG. 23 illustrates an example of the installation of the display apparatus according to an embodiment of the disclosure.

FIG. 21 illustrates an example of the installation of the display apparatus. FIG. 22 illustrates an example of the installation of the display apparatus. FIG. 23 illustrates an example of the installation of the display apparatus.

The display apparatus 1 may include a support member S1, S2 or S3 for mounting and/or supporting the plurality of display units 10. The plurality of display units 10 may be in a floating state from the floor through the support member S1, S2 or S3. For example, the support member S1, S2, or S3 may be provided in the form of a stand, a wall mount, an arm, etc. For example, the support member S1, S2, or S3 may be provided to be interchangeable.

The connection brackets 20 and 20' may include a mounting member 23 configured to be coupled to various support members S1, S2, and S3. The mounting member 23 may be provided on at least one of the plurality of panels 20*a*, 20*b*, and 20*c*. For example, the mounting member 23 may be formed on the first panel 20*a*. However, the present disclosure is not limited thereto, and the mounting member 23 may be formed on the second panel 20*b* and/or the third panel 20*c* according to embodiments. For example, the mounting member 23 may include a plurality of Video Electronics Standards Association (VESA) holes 23*h* formed according to the VESA standard.

For example, referring to FIG. 21, a support member S1 may be disposed on the floor to support the plurality of display units 10.

For example, referring to FIG. 22, a support member S2 may be mounted on a wall W of a structure F to support the plurality of display units 10. For example, the support member S2 may be provided to be coupled to an upper end of the wall W of the structure F.

For example, referring to FIG. 23, a support member S3 may be mounted on one end of the structure F to support the plurality of display units 10. For example, the support member S3 may function as a type of partition.

Figure 24:
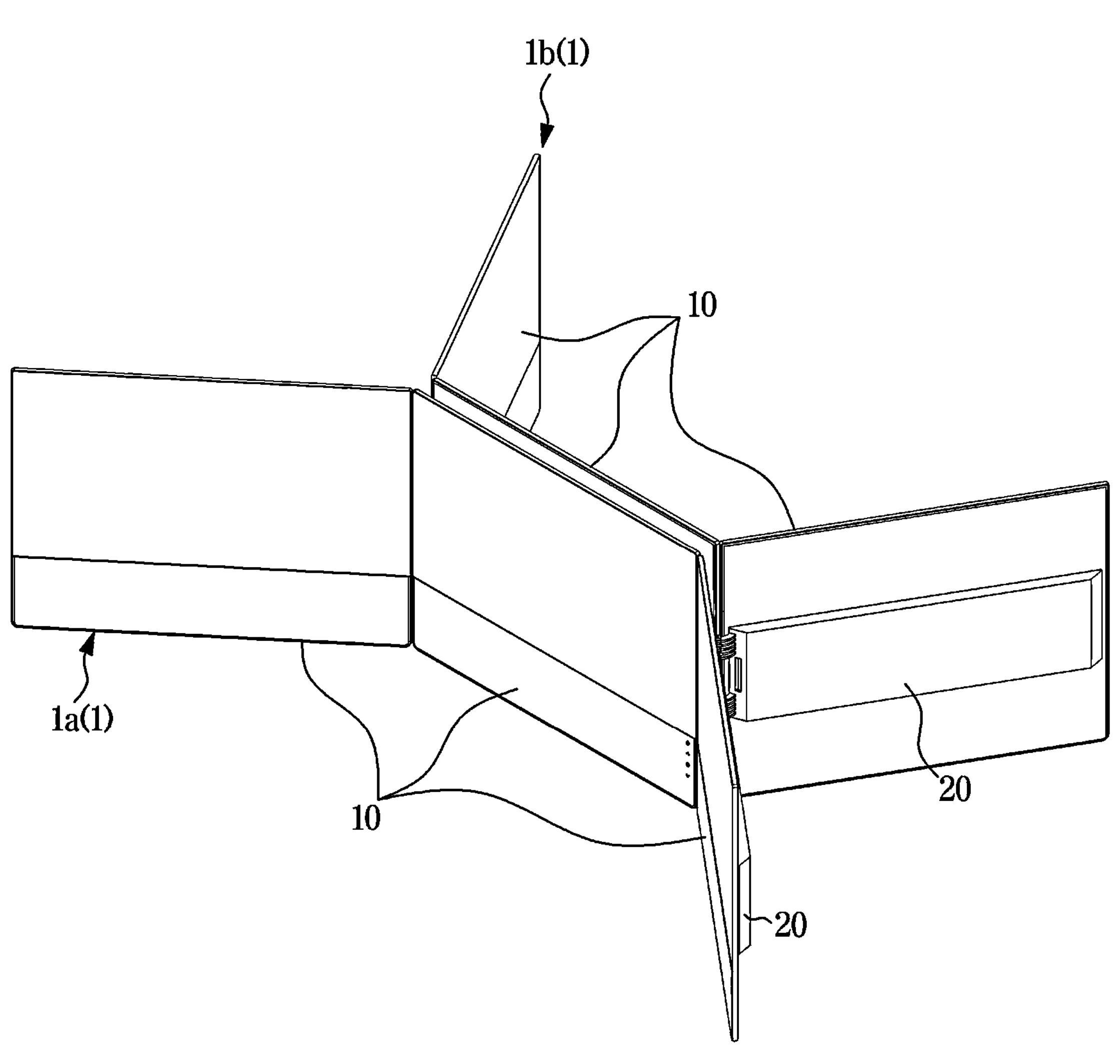
FIG. 24 illustrates an example of the arrangement of a first display apparatus and a second display apparatus according to an embodiment of the disclosure.
Figure 25:
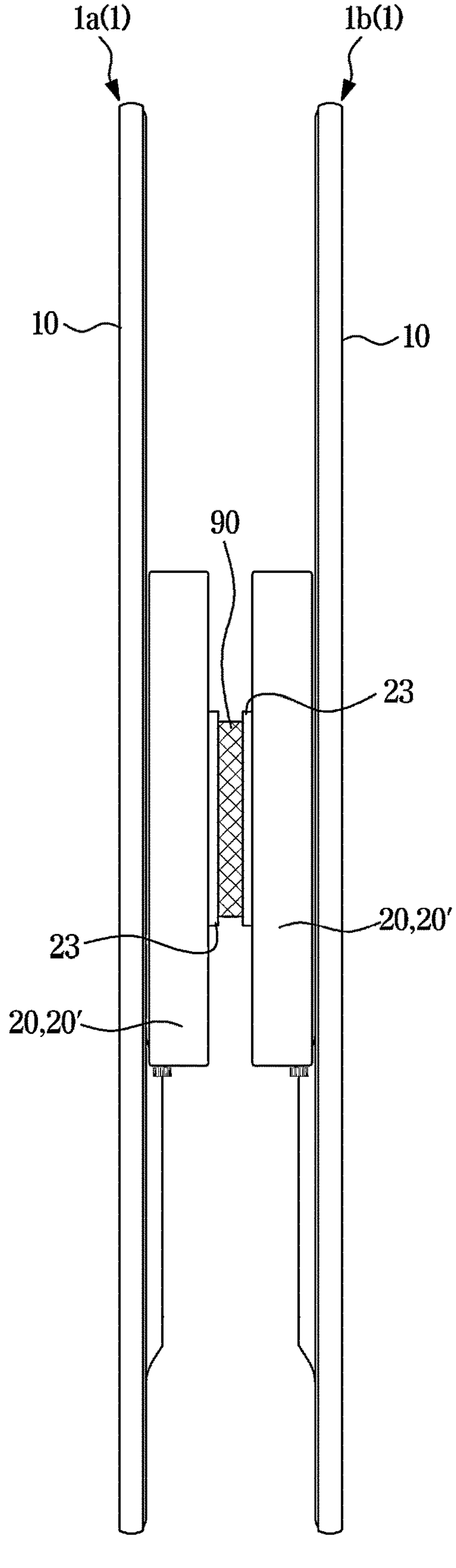
FIG. 25 illustrates a side view of an example of the arrangement of the first display apparatus and the second display apparatus according to an embodiment of the disclosure.

FIG. 24 illustrates an example of the arrangement of a first display apparatus and a second display apparatus. FIG. 25 illustrates a side view of an example of the arrangement of the first display apparatus and the second display apparatus.

Referring to FIG. 24, the screen of the first display apparatus 1*a* and the screen of the second display apparatus 1*b* may be arranged to face different directions. For example, as each of the first display apparatus 1*a* and the second display apparatus 1*b* is provided in the folded state, a work space by the first display apparatus 1*a* and a work space by the second display apparatus 1*b* may be created. Accordingly, a separate partition may not be needed between the first display apparatus 1*a* and the second display apparatus 1*b*.

Referring to FIG. 25, the first display apparatus 1*a* and the second display apparatus 1*b* may be coupled to each other through the mounting members 23. For example, the mounting member 23 of the first display apparatus 1*a* and the mounting member 23 of the second display apparatus 1*b* may be directly coupled or indirectly coupled through a separate fastening member 90. As a result, the first display apparatus 1*a* and the second display apparatus 1*b* may be restrained to each other and maintained in a fixed position. The first display apparatus 1*a* and the second display apparatus 1*b* may be prevented from falling down.

The present disclosure is not limited to FIGS. 24 and 25, and the plurality of display apparatus 1 may be arranged in various ways according to the user's needs.

According to one embodiment, the display apparatus 1 may include the first display unit 10*a* including the first connector 100, the second display unit 10*b* disposed adjacent to one side of the first display unit and including the second connector 200, and the connection bracket 20 configured to connect the first display unit and the second display unit. The connection bracket 20 may include the first panel 20*a* configured to be mounted on the first display unit, the third connector 300 formed on the first panel and configured to be electrically connected to the first connector, the second panel 20*b* configured to be mounted on the second display unit, the fourth connector 400 formed on the second panel and configured to be electrically connected to the second connector, and the hinge 30 configured to be slidable between the first panel and the second panel so as to adjust an angle between the first display unit on which the first panel is mounted and the second display unit on which the second panel is mounted.

As the hinge 30 slides, the length of the hinge may be variable.

The hinge may include the first hinge portion 310 extending from the first panel, and the second hinge portion 320 extending from the second panel and slidably coupled to the first hinge portion.

The hinge may include the hinge rail 330 formed on one of the first hinge portion and the second hinge portion, and the hinge protrusion 340 formed on the other of the first hinge portion and the second hinge portion and configured to perform a relative movement along the hinge rail.

The hinge may include the hinge groove 350 formed on one of the first hinge portion and the second hinge portion and provided to open toward the other of the first hinge portion and the second hinge portion. The hinge may include the hinge protruding portion 360 formed on the other of the first hinge portion and the second hinge portion and configured to be inserted into the hinge groove. The hinge protruding portion 360 may be configured to be withdrawn from and inserted into the hinge groove.

The connection bracket 20 may be provided to extend from the rear side of the first display unit to the rear side of the second display unit along the direction in which the first display unit and the second display unit are arranged.

The first display unit may include the first side 14*a* adjacent to the second display unit and extending along the vertical direction, and the second side 15*a* spaced apart from the first side and extending along the vertical direction. The second display unit may include the third side 15*b* adjacent to the first side of the first display unit and extending along the vertical direction, and the fourth side 14*b* spaced apart from the third side and extending along the vertical direction. The front edge 19*a* of the first side and the front edge 19*b* of the third side may come into contact with each other as the hinge slides.

The hinge may include the first hinge portion 310 extending from the first panel, and the second hinge portion 320 extending from the second panel and coupled to the first hinge portion. Each of the first hinge portion and the second hinge portion may be rotatable with respect to the point where the front edge 19*a* of the first side and the front edge 19*b* of the third side come into contact with each other.

The first display unit may further include the fifth connector 500 closer to the second side than the first connector, and the second display unit may further include the sixth connector 600 closer to the fourth side than the second connector. The connection bracket may include the seventh connector 700 formed on the first panel and configured to be electrically connected to the fifth connector, and the eighth connector 800 formed on the second panel and configured to be electrically connected to the sixth connector.

The first display unit may further include the fifth connector 500 closer to the second side than the first connector, and the second display unit may further include the sixth connector 600 closer to the fourth side than the second connector. The first panel of the connection bracket may have the extended shape to cover the first connector and the fifth connector, and the second panel of the connection bracket may have the extended shape to cover the second connector and the sixth connector.

The hinge 30 may have a shape that is convexly curved backward.

The display apparatus 1 may further include the third display unit 10*c* disposed adjacent to the other side of the first display unit and including the fifth connector 900. The first display unit may further include the sixth connector 500 spaced apart from the first connector and disposed closer to the third display unit than the first connector. The hinge may be the first hinge 30*a*. The connection bracket may include the third panel 20*c* configured to be mounted on the third display unit, the seventh connector 1100 formed on the third panel and configured to be electrically connected to the fifth connector, the eighth connector 700 formed on the first panel and configured to be electrically connected to the sixth connector, and the second hinge 30*b* configured to be slidable between the first panel and the third panel to adjust an angle between the first display unit on which the first panel is mounted and the third display unit on which the third panel is mounted.

The connection bracket may further include the position adjusting device 80 configured to vertically move at least one of the third connector connected to the first connector or the fourth connector connected to the second connector.

The first display unit may include the first coupler 60*a* and the second display unit may include the second coupler 60*b*. The connection bracket may include the third coupler 70*a* formed on the first panel and coupled to the first coupler, and the fourth coupler 70*b* formed on the second panel and coupled to the second coupler.

An attractive force may act between the first coupler 60*a* and the third coupler 70*a*. An attractive force may act between the second coupler 60*b* and the fourth coupler 70*b*.

The third connector and the fourth connector may be electrically connectable. The first display unit 10*a* and the second display unit 10*b* may be configured to transmit and receive at least one of power, control signals, and video signals through the connection bracket 20.

While the position adjusting device 80 moves the third connector 300 coupled to the first connector 100, the first gap 221 may be formed between the first panel and the third connector so as to allow the third connector 300 to be maintained in a state of being coupled to the first connector 100. While the position adjusting device 80 moves the fourth connector 400 coupled to the second connector 200, the second gap 222 may be formed between the second panel and the fourth connector so as to allow the fourth connector 400 to be maintained in a state of being coupled to the second connector 200.

According to one embodiment, the connection bracket may be configured to connect the first display unit including the first connector to the second display unit disposed adjacent the first display unit and including the second connector. The connection bracket may include the first panel 20*a* configured to be mounted on the rear side of the first display unit, the third connector 300 formed on the first panel and configured to be electrically connected to the first connector, the second panel 20*b* configured to be mounted on the rear side of the second display unit, the fourth connector 400 formed on the second panel and configured to be electrically connected to the second connector, and the hinge 30 configured to be slidable between the first panel and the second panel so as to allow a length of the hinge to vary.

The hinge may include the hinge rail 330 having an arc shape. The hinge may include the hinge protrusion 340 configured to be movable between the first position P1 provided at one end of the hinge rail and the second position P2 provided at the other end of the hinge rail.

While the hinge protrusion is in the first position P1, the front surface of the first display unit and the front surface of the second display unit may be provided on the same plane.

While the hinge protrusion is in the second position P2, the angle formed by the first display unit and the second display unit may be less than 180 degrees.

The first panel may extend between both sides 14*a* and 15*a* of the first display unit along the direction in which the first display unit and the second display unit are arranged. The second panel may extend between both sides 14*b* and 15*b* of the second display unit along the direction in which the first display unit and the second display unit are arranged.

As is apparent from the above description, it is easy to electrically connect a plurality of display units.

Further, it is easy to fold and/or tilt between a plurality of display units.

Further, a plurality of display units may be arranged in various combinations, thereby creating various working environments.

Further, a separate cable may not be required when electrically connecting a plurality of display units.

Further, aesthetics of a display apparatus may be improved.

Additional aspects of the disclosure will be set forth in part in the description which follows and, in part, will be obvious from the description, or may be learned by practice of the disclosure.

While the present disclosure has been particularly described with reference to exemplary embodiments, it should be understood by those of skilled in the art that various changes in form and details may be made without departing from the spirit and scope of the present disclosure.

The invention claimed is:

1. A display apparatus comprising:

a first display unit including a first connector;

a second display unit including a second connector; and a connection bracket configured to connect the first display unit and the second display unit, wherein the connection bracket includes:

a first panel configured to be mounted on the first display unit, a third connector on the first panel and configured to be electrically connected to the first connector, a second panel configured to be mounted on the second display unit, a fourth connector on the second panel and configured to be electrically connected to the second connector, and a hinge configured to be slidable between the first panel and the second panel so as to adjust an angle between the first display unit and the second display unit while the first panel is mounted on the first display unit, the third connector is electrically connected to the first connector, the second panel is mounted on the second display unit, and the fourth connector is electrically connected to the second connector.

2. The display apparatus of claim 1, wherein as the hinge slides, a length of the hinge is variable.

3. The display apparatus of claim 1, wherein the hinge includes:

a first hinge portion extending from the first panel, and a second hinge portion extending from the second panel, and the first hinge portion and the second hinge portion are couplable together to be slidable relative to one another.

4. The display apparatus of claim 3, wherein the hinge includes:

a hinge rail formed on one of the first hinge portion and the second hinge portion, and a hinge protrusion formed on the other of the first hinge portion and the second hinge portion and configured to be moved along the hinge rail when the first hinge portion and the second hinge portion are sliding relative to one another.

5. The display apparatus of claim 3, wherein the hinge includes:

a hinge groove formed on one of the first hinge portion and the second hinge portion so as to be open toward the other of the first hinge portion and the second hinge portion, and a hinge protruding portion formed on the other of the first hinge portion and the second hinge portion and configured to be inserted into the hinge groove, and the hinge protruding portion is configured to be withdrawn from, and inserted into, the hinge groove.

6. The display apparatus of claim 1, wherein the connection bracket extends from a rear side of the first display unit to a rear side of the second display unit along a direction in which the first display unit and the second display unit are arranged.

7. The display apparatus of claim 1, wherein the first display unit includes:

a first side adjacent to the second display unit and extending along a vertical direction, and a second side spaced apart from the first side and extending along the vertical direction, and the second display unit includes:

a third side adjacent to the first side of the first display unit and extending along the vertical direction, and a fourth side spaced apart from the third side and extending along the vertical direction, and a front edge of the first side and a front edge of the third side come into contact with each other as the hinge slides.

8. The display apparatus of claim 7, wherein the hinge includes:

a first hinge portion extending from the first panel; and a second hinge portion extending from the second panel and coupled to the first hinge portion, and each of the first hinge portion and the second hinge portion is rotatable with respect to a point where the front edge of the first side and the front edge of the third side come into contact with each other.

9. The display apparatus of claim 7, wherein the first display unit includes:

a fifth connector closer to the second side than the first connector, the second display unit includes:

a sixth connector closer to the fourth side than the second connector, the connection bracket includes:

a seventh connector on the first panel and configured to be electrically connected to the fifth connector, and an eighth connector on the second panel and configured to be electrically connected to the sixth connector.

10. The display apparatus of claim 7, wherein the first display unit includes:

a fifth connector closer to the second side than the first connector, the second display unit includes:

a sixth connector closer to the fourth side than the second connector, the first panel of the connection bracket is configured to cover the first connector and the fifth connector, and the second panel of the connection bracket is configured to cover the second connector and the sixth connector.

11. The display apparatus of claim 1, further comprising:

a third display unit including a fifth connector, wherein the first display unit includes a sixth connector spaced apart from the first connector, the hinge is a first hinge, the connection bracket includes:

a third panel configured to be mounted on the third display unit, a seventh connector on the third panel and configured to be electrically connected to the fifth connector, an eighth connector on the first panel and configured to be electrically connected to the sixth connector, and a second hinge configured to be slidable between the first panel and the third panel to adjust an angle between the first display unit and the third display unit while the first panel is mounted on the first display unit, the eighth connector is electrically connected to the sixth connector, the third panel is mounted on the third display unit, and the seventh connector is electrically connected to the fifth connector.

12. The display apparatus of claim 1, wherein the connection bracket includes:

a position adjusting device configured to vertically move at least one of the third connector connected to the first connector and the fourth connector connected to the second connector.

13. The display apparatus of claim 1, wherein the first display unit includes a first coupler, the second display unit includes a second coupler, and the connection bracket includes:

a third coupler on the first panel and coupled to the first coupler, and a fourth coupler on the second panel and coupled to the second coupler.

14. The display apparatus of claim 1, wherein the third connector and the fourth connector are electrically connectable, and the first display unit and the second display unit are configured to transmit and receive at least one of power, control signals, and video signals through the connection bracket.

15. The display apparatus of claim 1, wherein the connection bracket includes:

a first position adjusting device configured to vertically move the third connector connected to the first connector, and a second position adjusting device configured to vertically move the fourth connector connected to the second connector, while the first position adjusting device moves the third connector coupled to the first connector, a first gap is formed between the first panel and the third connector so as to allow the third connector to be maintained in a state of being coupled to the first connector, and while the second position adjusting device moves the fourth connector coupled to the second connector, a second gap is formed between the second panel and the fourth connector so as to allow the fourth connector to be maintained in a state of being coupled to the second connector.

* * * * *